(12) United States Patent
Park et al.

(10) Patent No.: US 12,405,481 B2
(45) Date of Patent: Sep. 2, 2025

(54) APPARATUS FOR MANUFACTURING DISPLAY DEVICE

(71) Applicant: Samsung Display Co., LTD., Yongin-si (KR)

(72) Inventors: Cheol Ho Park, Yongin-si (KR); Je Kil Ryu, Yongin-si (KR); Young Su Chae, Yongin-si (KR); Akifumi Sangu, Yongin-si (KR); Hae Sook Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/754,827

(22) Filed: Jun. 26, 2024

(65) Prior Publication Data
US 2025/0180921 A1  Jun. 5, 2025

(30) Foreign Application Priority Data

Nov. 30, 2023  (KR) .......... 10-2023-0170769

(51) Int. Cl.
| | | |
|---|---|---|
| *G02B 27/14* | (2006.01) | |
| *B23K 26/352* | (2014.01) | |
| *B23K 26/70* | (2014.01) | |
| B23K 103/00 | (2006.01) | |
| H01L 21/02 | (2006.01) | |
| H10K 71/40 | (2023.01) | |

(52) U.S. Cl.
CPC .......... *G02B 27/141* (2013.01); *B23K 26/352* (2015.10); *B23K 26/704* (2015.10); *B23K 26/705* (2015.10); B23K 2103/56 (2018.08); H01L 21/02686 (2013.01); H10K 71/421 (2023.02)

(58) Field of Classification Search
CPC .. G02B 27/141; B23K 26/352; B23K 26/705; B23K 2103/56; H10K 71/421; H01L 21/02686
See application file for complete search history.

(56) References Cited

U.S. PATENT DOCUMENTS

2017/0079718 A1* 3/2017 Zabar .................. A61B 18/245

FOREIGN PATENT DOCUMENTS

| CN | 108231558 A | 6/2018 |
|---|---|---|
| JP | 2000249607 A | 9/2000 |
| JP | 2016105492 A | 6/2016 |

(Continued)

*Primary Examiner* — Georgia Y Epps
*Assistant Examiner* — Don J Williams
(74) *Attorney, Agent, or Firm* — CANTOR COLBURN LLP

(57) ABSTRACT

An apparatus for manufacturing a display device includes a chamber, a laser module including a plurality of laser generators which respectively generates a plurality of raw laser beams using a solid material as a medium, a beam coupling module which combines the plurality of raw laser beams into a plurality of coupling beams, a beam mixing unit which converts the plurality of coupling beams into a plurality of mixing beams, a micro smoother which induces vibration movements of the plurality of mixing beams, an optical module which converts the plurality of mixing beams passed through the micro smoother into a final laser beam, and directs the final laser beam to the chamber, and a seal box disposed between the optical module and the chamber.

20 Claims, 26 Drawing Sheets

(56) References Cited

FOREIGN PATENT DOCUMENTS

| KR | 1020080106017 A | 12/2008 |
| KR | 1020090004704 A | 1/2009 |
| KR | 1020180131667 A | 12/2018 |
| KR | 101963510 B1 | 3/2019 |
| KR | 1020220042325 A | 4/2022 |
| KR | 102409834 B1 | 6/2022 |

\* cited by examiner

FIG. 7
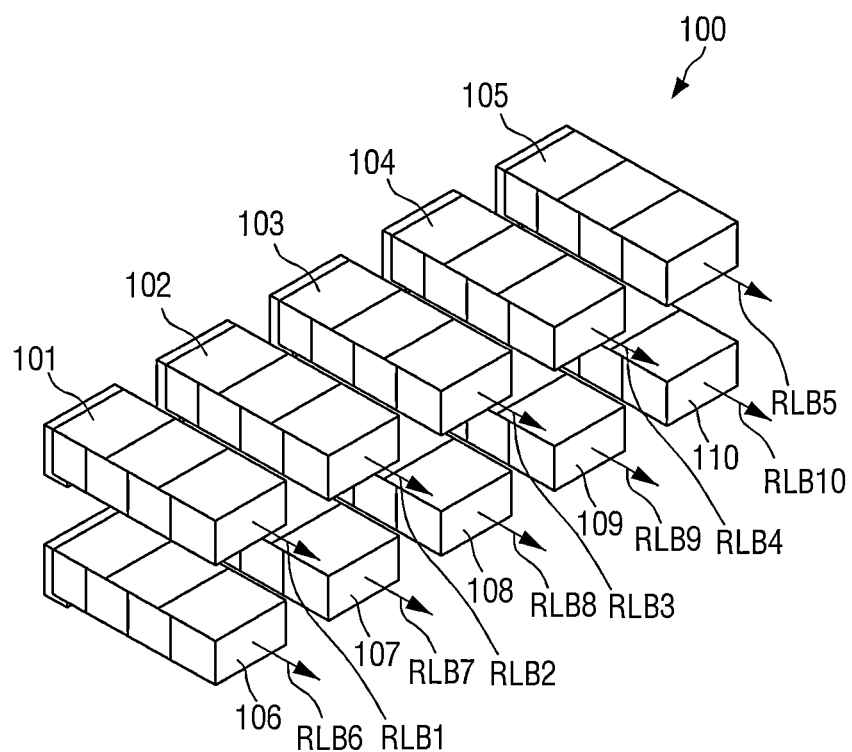
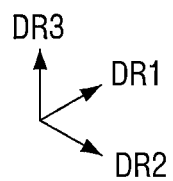

FIG. 14
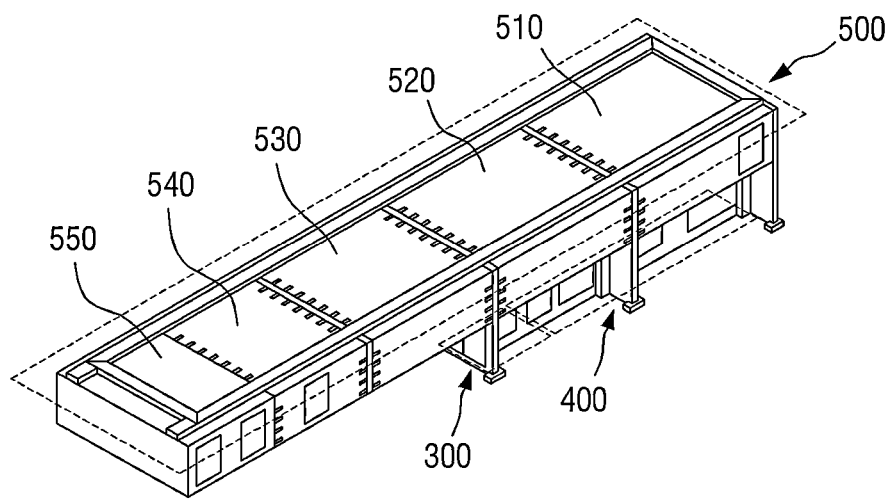
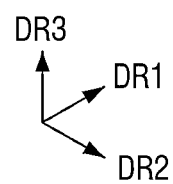

FIG. 18
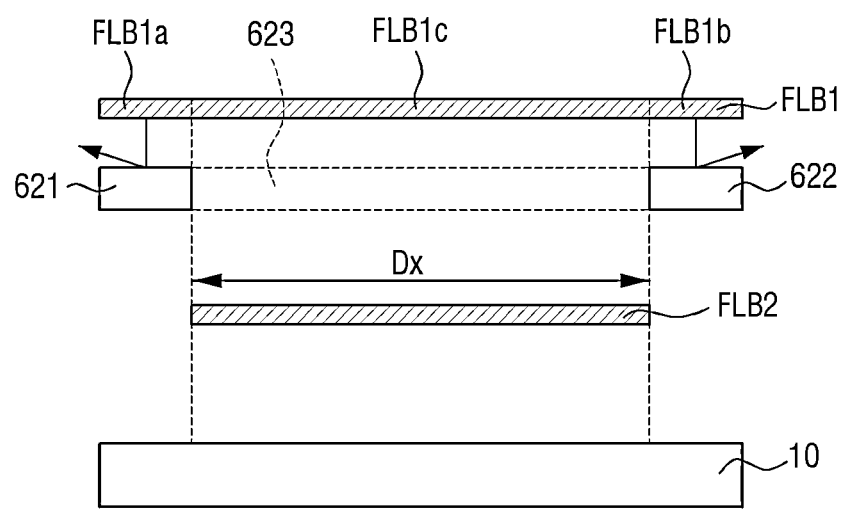
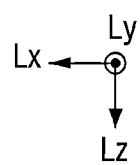
620 : 621, 622, 623

FIG. 19
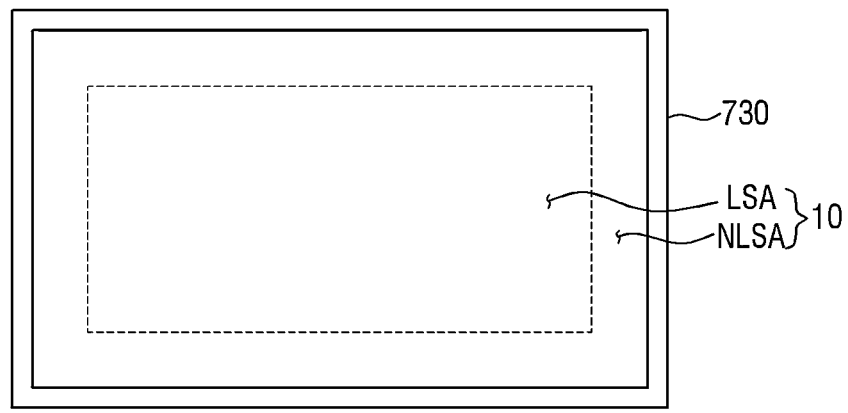
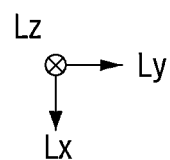

APPARATUS FOR MANUFACTURING DISPLAY DEVICE

APPARATUS FOR MANUFACTURING DISPLAY DEVICE

This application claims priority to Korean Patent Application No. 10-2023-0170769, filed on Nov. 30, 2023, and all the benefits accruing therefrom under 35 U.S.C. § 119, the content of which in its entirety is herein incorporated by reference.

BACKGROUND

1. Field

Embodiments of the disclosure relate to an apparatus for manufacturing a display device.

2. Description of the Related Art

With the advance of information-oriented society, demands on display devices for displaying images are increasing in various fields. The display device may be a display device such as a liquid crystal display, a field emission display or a light emitting display. The light emitting display may include an organic light emitting display device including an organic light emitting diode as a light emitting element or an inorganic light emitting display device including an inorganic light emitting diode as a light emitting element.

The display device may control the emission status and intensity of each pixel using a thin film transistor. The thin film transistor includes a semiconductor layer, a gate electrode, source/drain electrodes, and the like. Polycrystalline silicon (poly-Si), which is a crystallization of amorphous silicon (a-Si), is commonly used in the semiconductor layer. One method of annealing to crystallize amorphous silicon (a-Si) into polysilicon (p-Si) is laser annealing, which involves irradiating the amorphous silicon (a-Si) with a laser beam to crystallize it.

SUMMARY

Embodiments of the disclosure provide an apparatus for manufacturing a display device with improved efficiency and reliability of an annealing process.

However, embodiments of the disclosure are not restricted to the one set forth herein. The above and other features of embodiments of the disclosure will become more apparent to one of ordinary skill in the art to which the disclosure pertains by referencing the detailed description of the disclosure given below.

According to an embodiment of the disclosure, an apparatus for manufacturing a display device includes a chamber, a laser module including a plurality of laser generators which respectively generates a plurality of raw laser beams using a solid material as a medium, a beam coupling module which combines the plurality of raw laser beams into a plurality of coupling beams, a beam mixing unit which convert the plurality of coupling beams into a plurality of mixing beams, a micro smoother which induces vibration movements of the plurality of mixing beams, an optical module which converts the plurality of mixing beams that have passed through the micro smoother into a final laser beam, and directs the final laser beam to the chamber, and a seal box disposed between the optical module and the chamber.

In an embodiment, a major axis size of the final laser beam may be in a range of about 1,000 millimeters (mm) to about 2,000 mm, a minor axis size of the final laser beam may be in a range of about 95 micrometers ($\mu$m) to about 110 $\mu$m, and a horizontal length of a lateral inclined surface of the final laser beam may be in a range of about 30 $\mu$m to about 45 $\mu$m.

In an embodiment, a total laser output of the laser module may be in a range of about 5,760 watts (W) to about 9,000 W, an output of each of the plurality of laser generators may be in a range of about 600 watts W to about 900 W, and an oscillation frequency of each of the plurality of laser generators may be in a range of about 5,000 hertz (Hz) to about 15,000 Hz.

In an embodiment, each of the plurality of raw laser beams may be a laser beam in an ultraviolet region, and a wavelength of the plurality of raw laser beams may be in a range of about 337 nanometers (nm) to about 357 nm.

In an embodiment, the beam coupling module may include a shutter which receives the plurality of raw laser beams, and a photodiode and a beam monitor which monitors the plurality of raw laser beams, where an operation speed of the shutter may be in a range of about 20 milliseconds (ms) to about 100 ms.

In an embodiment, the beam coupling module may include a scraper unit which generates a plurality of coupling beams, and groups the plurality of raw laser beams to be included in the plurality of coupling beams, a group telescope unit which adjusts a degree of diffusion of the plurality of coupling beams, and a group coupling unit which provides the plurality of coupling beams to the beam mixing unit.

In an embodiment, the scraper unit may include a pre-mixer, and the pre-mixer may transmit and reflect the plurality of coupling beams which are incident at a ratio of 1:1.

In an embodiment, the beam coupling module may further include a pulse extender module disposed between the group coupling unit and the beam mixing unit, and to the pulse extender module may extend a pulse duration of the final laser beam.

In an embodiment, the beam mixing unit may include a reflection mirror which reflects the plurality of incident coupling beams incident thereto, a first splitter which transmits and reflects the plurality of incident coupling beams at a ratio of 1:1, and a second splitter which transmits and reflects the plurality of incident coupling beams at a ratio of 2:1.

In an embodiment, the beam mixing unit may generate the plurality of mixing beams by combining the plurality of coupling beams at a same ratio.

In an embodiment, the micro smoother may provide a driving force to regularly or irregularly vibrate a hit point of the final laser beam with respect to a direction perpendicular to a scan direction of the final laser beam.

In an embodiment, the micro smoother may include at least one selected from, a first micro smoother comprising a telescope lens, and a second micro smoother comprising a homogenizer.

In an embodiment, the micro smoother may include a cover, a floating box disposed in an inner space of the cover in a floating state, and an elastic tube connecting the floating box to the cover.

In an embodiment, the apparatus may further include a first section where the micro smoother is located, a second section where the chamber is located, and a basic frame disposed below the chamber and the micro smoother, wherein the basic frame comprises a first pedestal disposed in the first section and a second pedestal disposed in the second section, and the first pedestal and the second pedestal are disposed to be spaced apart from each other.

In an embodiment, the optical module may include a first sub-optical module disposed in the first section, and a second sub-optical module disposed in the second section, and the first sub-optical module and the second sub-optical module are disposed to be spaced apart from each other.

In an embodiment, the seal box may include a beam cutter which reflects a portion of the final laser beam and transmits a remaining portion of the final laser beam, and a beam dump which attenuates or extinguishes energy of the portion of the final laser beam reflected from the beam cutter.

In an embodiment, the beam cutter may include a reflection area which reflects the final laser beam, and a surface of the reflection area contains glass.

In an embodiment, the apparatus may further include a reflection mirror disposed on an inner surface of the beam dump, and a cooler disposed inside the beam dump.

In an embodiment, the chamber may include a meter which measures a profile or power of the final laser beam, and a measurement aperture disposed on the meter, where the measurement aperture reflects a portion of the final laser beam and transmit a remaining portion of the final laser beam.

In an embodiment, the measurement aperture may include a reflection area which reflects the final laser beam, and a transmission area which transmits the final laser beam, where the reflection area may include a high reflection (HR) coating film, and the transmission area may include an anti-reflection (AR) coating film or a hole.

In the apparatus for manufacturing the display device according to an embodiment of the disclosure, the efficiency and reliability of the annealing process may be improved.

However, effects according to the embodiments of the disclosure are not limited to those exemplified above and various other effects are incorporated herein.

BRIEF DESCRIPTION OF THE DRAWINGS

The above and other features of embodiments of the disclosure will become more apparent by describing in detail embodiments thereof with reference to the accompanying drawings, in which:

FIG. 7 is a perspective view showing a laser module according to an embodiment;

FIG. 14 is a perspective view illustrating the beam mixing unit, the micro smoother, and the optical module according to an embodiment;

FIG. 18 is a cross-sectional view illustrating an operation method of a beam cutter according to an embodiment;

FIG. 19 is a plan view illustrating a fixing chuck and a target substrate according to an embodiment;

DETAILED DESCRIPTION

Figure 1:
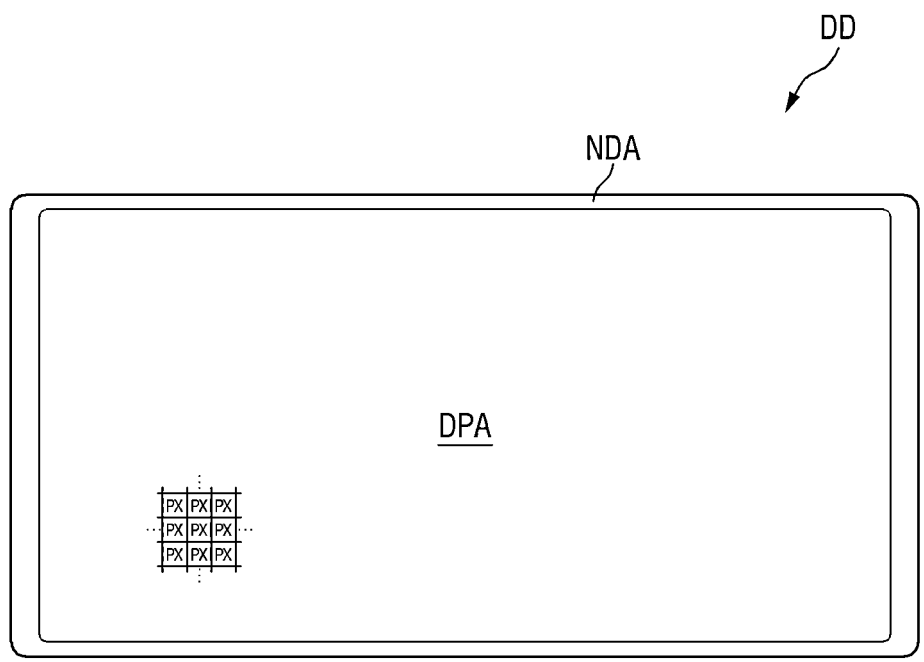
FIG. 1 is a plan view illustrating a display device according to an embodiment.

The invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. Thus, reference to "an" element in a claim followed by reference to "the" element is inclusive of one element and a plurality of the elements. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the disclosure will be described in detail with reference to the accompanying drawings.

FIG. 1 is a plan view illustrating a display device according to an embodiment.

Referring to FIG. 1, an embodiment of a display device DD may display a moving image or a still image. The display device DD may include any electronic device including a display screen. Examples of the display device DD may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which include a display screen.

The shape of the display device DD may be variously modified. In an embodiment, for example, the display device DD may have a shape such as a rectangular shape elongated in a horizontal direction, a rectangular shape elongated in a vertical direction, a square shape, a quadrilateral shape with rounded corners (vertices), other polygonal shapes and a circular shape. The shape of a display area DPA of the display device DD may also be similar to the overall shape of the display device DD. In an embodiment, as shown in FIG. 1, the display device DD and the display area DPA may have a rectangular shape elongated in the horizontal direction, but the disclosure is not limited thereto.

In an embodiment, the display device DD may include the display area DPA and a non-display area NDA. The display area DPA is an area where a screen can be displayed, and the non-display area NDA is an area where a screen is not displayed. The display area DPA may also be referred to as an active region, and the non-display area NDA may also be referred to as a non-active region. The display area DPA may substantially occupy the center of the display device DD.

The display area DPA may include a plurality of pixels PX. The plurality of pixels PX may be arranged in a matrix form.

The non-display area NDA may be disposed around the display area DPA. The non-display area NDA may completely or partially surround the display area DPA. The display area DPA may have a rectangular shape, and the non-display area NDA may be disposed adjacent to four sides of the display area DPA.

Figure 2:
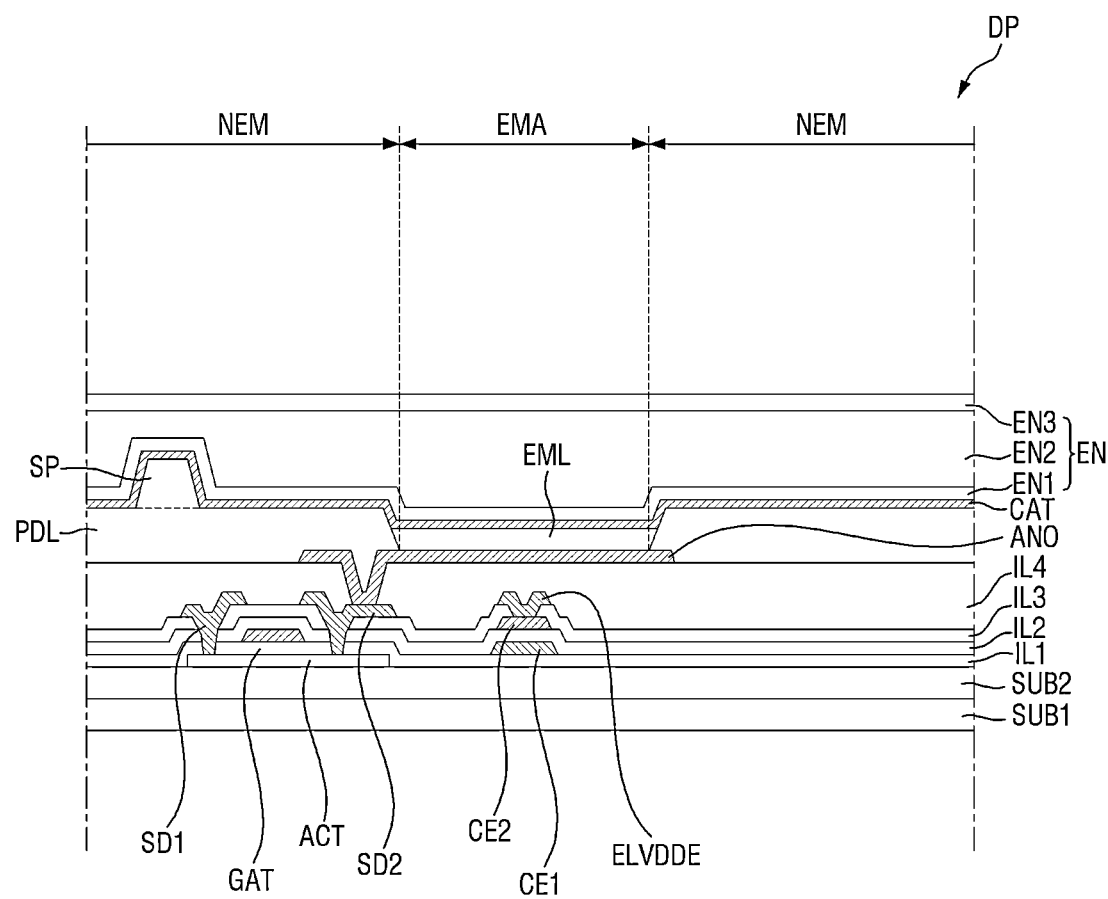
FIG. 2 is a cross-sectional view showing a display panel according to an embodiment.

FIG. 2 is a cross-sectional view showing a display panel according to an embodiment.

Referring to FIG. 2, an embodiment of the display device DD may include a display panel DP. The display panel DP displays a screen or an image and may be, for example, a self-luminous display panel, such as an organic light emitting display panel, an inorganic light emitting display panel, a quantum dot light emitting display panel, a micro light emitting diode (LED) display panel, a nano LED display panel, a plasma display panel, a field emission display panel, or a cathode ray display panel, as well as a light receiving display panel such as a liquid crystal display panel or an electrophoretic display panel. Hereinafter, for convenience of description, embodiments where the display panel DP is an organic light emitting display panel will be described as an example, but is not limited thereto.

In an embodiment, as shown in FIG. 2, the display panel DP may include a base substrate SUB1, a buffer layer SUB2, a semiconductor layer ACT, a first insulating layer IL1, a first gate conductive layer GCL1, a second insulating layer IL2, a second gate conductive layer GCL2, a third insulating layer IL3, a data conductive layer DCL, a fourth insulating layer IL4, an anode electrode ANO, a pixel defining layer PDL including an opening exposing the anode electrode ANO, a light emitting layer EML disposed in the opening of the pixel defining layer PDL, a cathode electrode CAT disposed on the light emitting layer EML and the pixel defining layer PDL, and a thin film encapsulation layer EN disposed on the cathode electrode CAT. Each of the layers described above may consist of (or defined by) a single layer, or a stack of multiple layers. Another layer may be further disposed between the respective layers.

The base substrate SUB1 may support respective layers disposed thereon. The base substrate SUB1 may include or be made of an insulating material such as a polymer resin or an inorganic material such as glass or quartz.

The buffer layer SUB2 is disposed on the base substrate SUB1. The buffer layer SUB2 may include silicon nitride, silicon oxide, silicon oxynitride, or the like.

The semiconductor layer ACT may be disposed on the buffer layer SUB2. The semiconductor layer ACT may form a channel of a thin film transistor of a pixel. The semiconductor layer ACT may include polycrystalline silicon crystallized by a display device manufacturing apparatus 1000 (see FIG. 3A), which will be described later. The semiconductor layer ACT may be formed by crystallizing an entire amorphous silicon thin film 11 (see FIG. 3A) disposed on a target substrate 10 (see FIG. 3A) and then patterning the crystallized amorphous silicon thin film 11, or may be formed by first patterning the amorphous silicon thin film 11 (see FIG. 3A) and then crystallizing the patterned amorphous silicon thin film 11 (see FIG. 3A). However, the disclosure is not limited thereto, and only a part of the amorphous silicon thin film 11 (see FIG. 3A) may be crystallized, so that the semiconductor layer ACT may include both an amorphous silicon region where amorphous silicon is disposed and a polycrystalline silicon region where polycrystalline silicon is disposed.

The first insulating layer IL1 may be disposed on the semiconductor layer ACT. The first insulating layer IL1 may be a gate insulating layer having a gate insulating function.

The first gate conductive layer GCL1 may be disposed on the first insulating layer IL1. The first gate conductive layer GCL1 may include a gate electrode GAT of a thin transistor of a pixel, a scan line connected thereto and a first electrode CE1 of a storage capacitor.

The second insulating layer IL2 may be disposed on the first gate conductive layer GCL1. The second insulating layer IL2 may be an interlayer insulating layer or a second gate insulating layer.

The second gate conductive layer GCL2 may be disposed on the second insulating layer IL2. The second gate conductive layer GCL2 may include a second electrode CE2 of the storage capacitor.

The third insulating layer IL3 may be disposed on the second gate conductive layer GCL2. The third insulating layer IL3 may be an interlayer insulating layer.

The data conductive layer DCL may be disposed on the third insulating layer IL3. The data conductive layer DCL may include a first electrode SD1, a second electrode SD2 and a first power line ELVDDE of the thin film transistor of the pixel. The first electrode SD1 and the second electrode SD2 of the thin film transistor may be electrically connected to a source region and a drain region of the semiconductor layer ACT via contact holes defined or formed through the third insulating layer IL3, the second insulating layer IL2 and the first insulating layer IL1.

The fourth insulating layer IL4 may be disposed on the data conductive layer DCL. The fourth insulating layer IL4 may cover the data conductive layer DCL. The fourth insulating layer IL4 may be a via layer.

The anode electrode ANO may be disposed on the fourth insulating layer IL4. The anode electrode ANO may be a pixel electrode provided for each pixel. The anode electrode ANO may be connected to the second electrode SD2 of the thin film transistor via the contact hole passing through the fourth insulating layer IL4.

The pixel defining layer PDL may be disposed on the anode electrode ANO. The pixel defining layer PDL may be disposed on the anode electrode ANO and may define an opening exposing the anode electrode ANO. The emission area EMA and the non-emission area NEM may be distinguished by the pixel defining layer PDL and the opening thereof.

A spacer SP may be disposed on the pixel defining layer PDL. The spacer SP may serve to maintain a gap with a structure disposed thereabove.

The light emitting layer EML may be disposed on the anode electrode ANO exposed by the pixel defining layer PDL. The light emitting layer EML may include an organic material layer. The organic material layer of the light emitting layer may include an organic light emitting layer, and may further include a hole injection/transport layer and/or an electron injection/transport layer.

The cathode electrode CAT may be disposed on the light emitting layer EML. The cathode electrode CAT may be a common electrode extended across all the pixels. The anode electrode ANO, the light emitting layer EML, and the cathode electrode CAT may constitute an organic light emitting element.

The thin film encapsulation layer EN including a first inorganic film EN1, a first organic film EN2 and a second inorganic film EN3 is disposed on the cathode electrode CAT. The first inorganic film EN1 and the second inorganic film EN3 may be in contact with each other at an end portion of the thin film encapsulation layer EN. The first organic film EN2 may be sealed by the first inorganic film EN1 and the second inorganic film EN3.

Each of the first inorganic film EN1 and the second inorganic film EN3 may include silicon nitride, silicon oxide, silicon oxynitride, or the like. The first organic film EN2 may include an organic insulating material.

Hereinafter, an embodiment of an apparatus for manufacturing a display device used to form a polycrystalline silicon thin film included in the semiconductor layer ACT described above will be described.

Figure 3A:
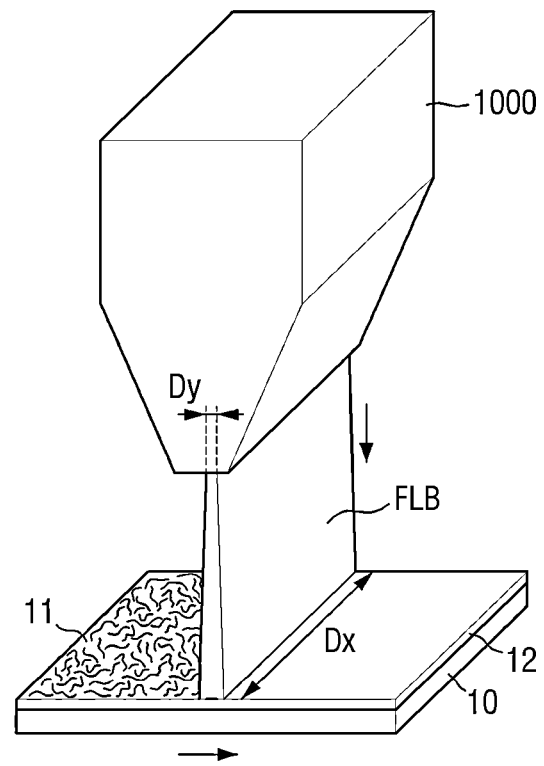
FIG. 3A is a perspective view illustrating an annealing process of a display device according to an embodiment.
Figure 3B:
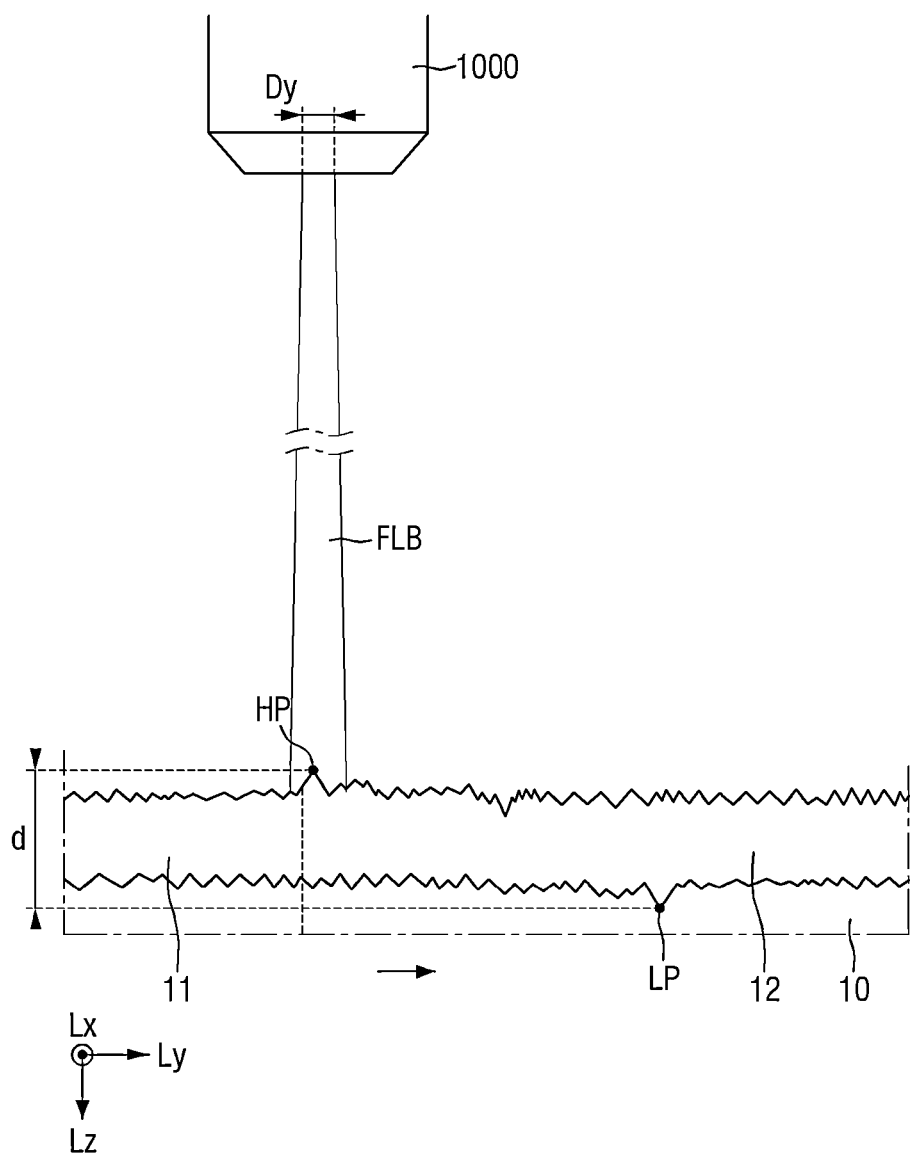
FIG. 3B is a cross-sectional view illustrating an annealing process of a display device according to an embodiment.
Figure 4A:
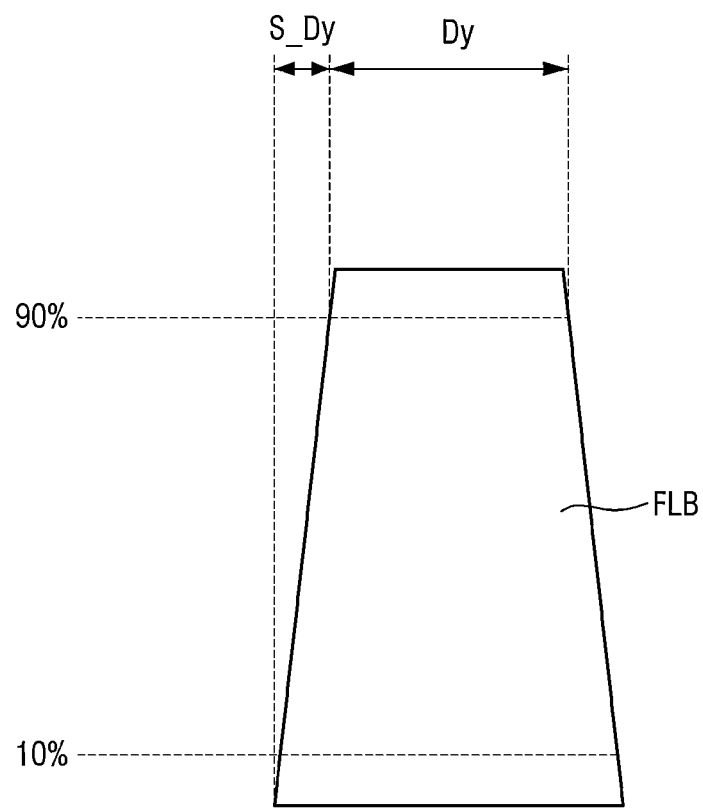
FIG. 4A is a front view showing the shape of a final laser beam according to an embodiment.
Figure 4B:
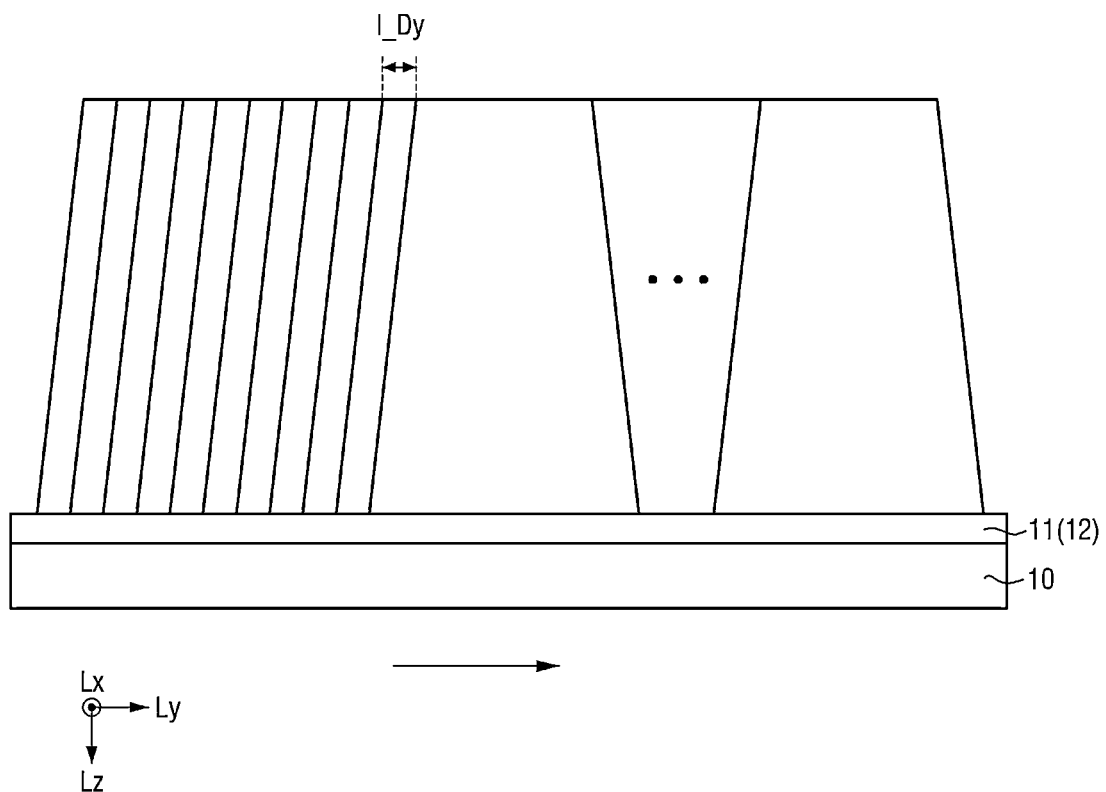
FIG. 4B is a front view cumulatively illustrating the locations where the final laser beam is irradiated as the target substrate according to an embodiment moves.

FIG. 3A is a perspective view illustrating an annealing process of a display device according to an embodiment. FIG. 3B is a cross-sectional view illustrating an annealing process of a display device according to an embodiment. FIG. 4A is a front view showing the shape of a final laser beam according to an embodiment. FIG. 4B is a front view cumulatively illustrating the locations where the final laser beam is irradiated as the target substrate according to an embodiment moves.

Referring to FIGS. 3A, 3B, 4A, and 4B, in an annealing process of a display device according to an embodiment, the amorphous silicon thin film 11 may be disposed on the target substrate 10. The target substrate 10 may be the base substrate SUB1 described above with reference to FIG. 2.

Herein, it is described as an example that the amorphous silicon thin film 11 is formed on the target substrate 10 and crystallized by the display device manufacturing apparatus 1000, but the disclosure is not limited thereto. In an embodiment, for example, the amorphous silicon thin film 11 may be an amorphous semiconductor layer that further includes another material in addition to silicon.

The amorphous silicon thin film 11 may be formed by a method such as chemical vapor deposition (CVD) or plasma CVD. In an embodiment, the amorphous silicon thin film 11 may be formed using silicon or a silicon compound (e.g., SixGey).

The amorphous silicon thin film 11 may have a uniform thickness in each region, but is not limited thereto. In an embodiment, for example, as shown in FIG. 3B, the amorphous silicon thin film 11 may include uneven top and bottom surfaces. In such an embodiment, the amorphous silicon thin film 11 may have different thicknesses in different regions due to its microstructure.

The display device manufacturing apparatus 1000 according to an embodiment may be a laser annealing apparatus that crystallizes the amorphous silicon thin film 11 into a polycrystalline silicon thin film 12 using (e.g., by radiating) a laser.

The display device manufacturing apparatus 1000 may provide a final laser beam FLB on the amorphous silicon thin film 11. The display device manufacturing apparatus 1000 may be positioned on the target substrate 10 when providing the final laser beam FLB on the amorphous silicon thin film 11. In an embodiment, for example, the display device manufacturing apparatus 1000 may be positioned above the target substrate 10 when providing the final laser beam FLB on the amorphous silicon thin film 11.

The display device manufacturing apparatus 1000 may radiate the final laser beam FLB to the amorphous silicon thin film 11 located on the target substrate 10. The amorphous silicon thin film 11 irradiated with the final laser beam FLB may be crystallized into the polycrystalline silicon thin film 12.

A large amount of energy may be used for effective crystallization of the amorphous silicon thin film 11. Therefore, it may be desirable for the energy provided per unit area of the region to be irradiated with the final laser beam FLB to be large. Accordingly, in an embodiment, the display device manufacturing apparatus 1000 may process a plurality of raw laser beams RLB (see FIG. 7) to form the final laser beam FLB. The process of processing the raw laser beams RLB (see FIG. 7) to form the final laser beam FLB will be described later with reference to FIG. 5 and the like.

When the amorphous silicon thin film 11 is crystallized at a temperature lower than the melting point, abnormal protrusions formed at grain boundaries can be reduced, thereby improving crystallinity. Therefore, it may be desirable to heat the amorphous silicon thin film 11 to a temperature lower than the melting point of the amorphous silicon thin film 11. In an embodiment, for example, when the melting temperature of the amorphous silicon thin film 11 is about 1460° C., the final laser beam FLB may be controlled to heat the amorphous silicon thin film to a temperature of about 1300° C. to 1400° C. The final laser beam FLB may be irradiated to the amorphous silicon thin film 11 for several nanoseconds (ns) to tens of nanoseconds (ns).

The amorphous silicon contained in the amorphous silicon thin film 11 may be melted by a rapid increase in temperature due to the final laser beam FLB being radiated thereto, and then cooled and recrystallized. In this way, the amorphous silicon thin film 11 may be crystallized into the polycrystalline silicon thin film 12 by the final laser beam FLB. The repeated melting and recrystallization of the amorphous silicon thin film 11 may cause unevenness on the surface, which may increase the surface roughness. That is, the surface roughness of the polycrystalline silicon thin film 12 may be greater than that of the amorphous silicon thin film 11.

The final laser beam FLB may be emitted in the form of a line beam extending in one direction and having a width in another direction. The final laser beam FLB may be emitted in a path direction Lz. The line shape of the final laser beam FLB may extend in a major axis direction Lx perpendicular to the path direction Lz, which is the emission direction, and may have a predetermined width in a minor axis direction Ly perpendicular to the path direction Lz.

In this specification and the drawings, the path direction Lz may refer to a travel direction of the laser, i.e., a direction along the movement path of the laser. The major axis direction Lx may refer to the extension direction of the laser, and the minor axis direction Ly may refer to the width direction of the laser. In some embodiments, the major axis direction Lx, the minor axis direction Ly, and the path direction Lz may be perpendicular to each other, but are not limited thereto. In the display device manufacturing apparatus 1000 according to an embodiment, the major axis direction Lx, the minor axis direction Ly, and the path direction Lz may be changed along the movement path of the laser.

As shown in FIGS. 3B and 4A, the final laser beam FLB may have a trapezoidal shape on a plane viewed in the major axis direction Lx. In an embodiment, for example, the final laser beam FLB may have a shape whose width increases from top to bottom on the plane viewed in the major axis direction Lx.

As shown in FIG. 4A, the beam profile shape of the final laser beam FLB may be a flat top type. Accordingly, uniform energy may be transmitted to the silicon thin films 11 and 12 in the region where the laser is irradiated.

The major axis direction Lx, which is the extension direction of the final laser beam FLB, may be referred to as a major axis direction, and the length in the major axis direction Lx may be referred to as a major axis size Dx.

The larger the major axis size Dx is, the larger the area of the amorphous silicon thin film 11 crystallized is. In some embodiments, the major axis size Dx may be equal to the length of the target substrate 10 in the major axis direction Lx. Accordingly, the process may be completed with only one scan in one direction, thereby improving process efficiency. In an embodiment, the major axis size Dx may be in a range of about 1000 millimeters (mm) to about 2000 mm. In an embodiment, for example, the major axis size Dx may be about 1500 mm.

The minor axis direction Ly, which is the thickness direction perpendicular to the extension direction of the final laser beam FLB, may be referred to as a minor axis direction, and the length in the minor axis direction Ly may be referred to as a minor axis size Dy. In an embodiment, the minor axis size Dy of the final laser beam FLB may be in a range of about 95 micrometers (μm) to about 110 μm. By having the minor axis size Dy that is small, the display device manufacturing apparatus 1000 according to an embodiment may provide greater energy per unit area to the silicon thin films 11 and 12, thereby improving crystallization quality.

As shown in FIG. 4A, the minor axis size Dy may be a width at a point that is 90% of the total height from the lower edge of the final laser beam FLB. In an embodiment, for example, the minor axis size Dy may be a horizontal length in the minor axis direction Ly at a point that is 90% of the total height from the lower edge of the final laser beam FLB on a plane viewed in the major axis direction Lx.

In some embodiments, an inclined surface size S_Dy of the final laser beam FLB may be in a range of about 30 μm to about 45 μm. The inclined surface size S_Dy may be a width of a portion corresponding to 10% to 90% of the total height from the lower edge of the final laser beam FLB. In an embodiment, for example, the inclined surface size S_Dy may be a horizontal length in the minor axis direction Ly of the portion corresponding to 10% to 90% of the total height from the lower edge of the final laser beam FLB. The inclined surface size S_Dy may be measured with respect to one of both opposing side surfaces of the final laser beam FLB.

Although not shown in the drawings, the target substrate 10 on which the amorphous silicon thin film 11 is formed may be placed on a movable stage (not shown). While the final laser beam FLB is being radiated, the movable stage (not shown) may uniformly move the target substrate 10 in the direction of an arrow to ensure that the amorphous silicon thin film 11 on the target substrate 10 is evenly irradiated with the final laser beam FLB.

In another embodiment, for example, the display device manufacturing apparatus 1000 may move and irradiate the final laser beam FLB while the target substrate 10 on which the amorphous silicon thin film 11 is formed remains stationary. In still another embodiment, for example, the display device manufacturing apparatus 1000 may irradiate the final laser beam FLB while moving together with the target substrate 10 on which the amorphous silicon thin film 11 is formed. In such an embodiment, the display device manufacturing apparatus 1000 and the target substrate 10 on which the amorphous silicon thin film 11 is formed may move at a same moving speed, but they are not limited thereto and may move at different speeds.

In some embodiments, as shown in FIG. 4B, the radiation region of the final laser beam FLB may overlap several times or more on the silicon thin films 11 and 12. A scan interval I_Dy of the final laser beam FLB may be smaller than the minor axis size Dy. In an embodiment, the scan interval I_Dy may be about 2 μm. Since the non-overlap ratio between adjacent final laser beams FLB is a ratio of the scan interval I_Dy to the minor axis size Dy, the overlap ratio between adjacent final laser beams FLB may be in a range of about 97.5% to about 98.5%. Since the number of radiation times of the final laser beam FLB at one point of the silicon thin films 11 and 12 is determined by the ratio of the scan interval I_Dy to the minor axis size Dy, the number of radiation times of the final laser beam FLB at one point of the silicon thin films 11 and 12 may be in a range of 47 to 55 times.

In an embodiment, the energy density per unit area of the final laser beam FLB may be in a range of about 310 millijoules per square centimeter (mJ/cm$^2$) to about 320 mJ/cm$^2$.

The display device manufacturing apparatus 1000 according to an embodiment may have a high overlap ratio and a larger number of irradiation times to increase the amount of energy applied to the silicon thin films 11 and 12, thereby improving crystallization quality. Accordingly, the amount of energy applied to the silicon thin films 11 and 12 may be increased without excessively increasing the output, oscillation frequency, or the like of the laser, thereby minimizing (or substantially reducing) thermal deformation and damage to optical components included in the display device manufacturing apparatus 1000.

Even when any one of the target substrate 10 and the display device manufacturing apparatus 1000 moves, the crystallization process speed may be determined based on the relative speed between the target substrate 10 and the display device manufacturing apparatus 1000. The process speed of the display device manufacturing apparatus 1000 according to an embodiment, i.e., the relative speed between the target substrate 10 and the display device manufacturing apparatus 1000, may be about 20 millimeters per second (mm/s), but is not limited thereto. This process speed may be calculated by multiplying the frequency of the raw laser beam RLB (see FIG. 7) by the scan interval I_Dy.

The top and bottom surfaces of the silicon thin films 11 and 12 may include unevenness. As shown in FIG. 3B, the top surface of the silicon thin films 11 and 12 may have a highest point HP protruding most to the other side of the path direction Lz, and the bottom surface thereof may have a lowest point LP protruding most to one side of the path direction Lz.

In order to achieve uniform crystallization of the amorphous silicon thin film 11, it is desired to provide uniform energy to each region. Substantially uniform energy may be provided to regions located within the depth of focus (DOF) of the final laser beam FLB from the focal plane. The depth of focus (DOF) refers to the distance where the focus is considered to be maintained, whether moving farther away from or closer to the focal plane. As the value of the depth of focus (DOF) for the final laser beam FLB increases, the region where substantially the same energy as the energy provided to the focal plane is provided may become broader. In other words, the focus of the final laser beam FLB may be formed within the amorphous silicon thin film 11, and it may be desirable for the depth of focus (DOF) of the final laser beam FLB to be at least greater than a level difference d between the highest point HP and the lowest point LP in order to achieve uniform crystallization of the amorphous silicon thin film 11.

Figure 5:
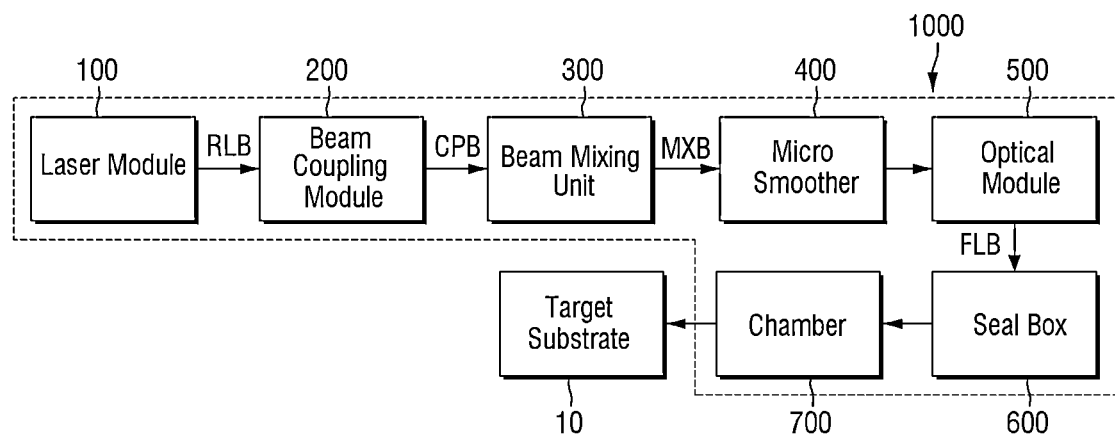
FIG. 5 is a schematic block diagram showing an apparatus for manufacturing a display device according to an embodiment.
Figure 6:
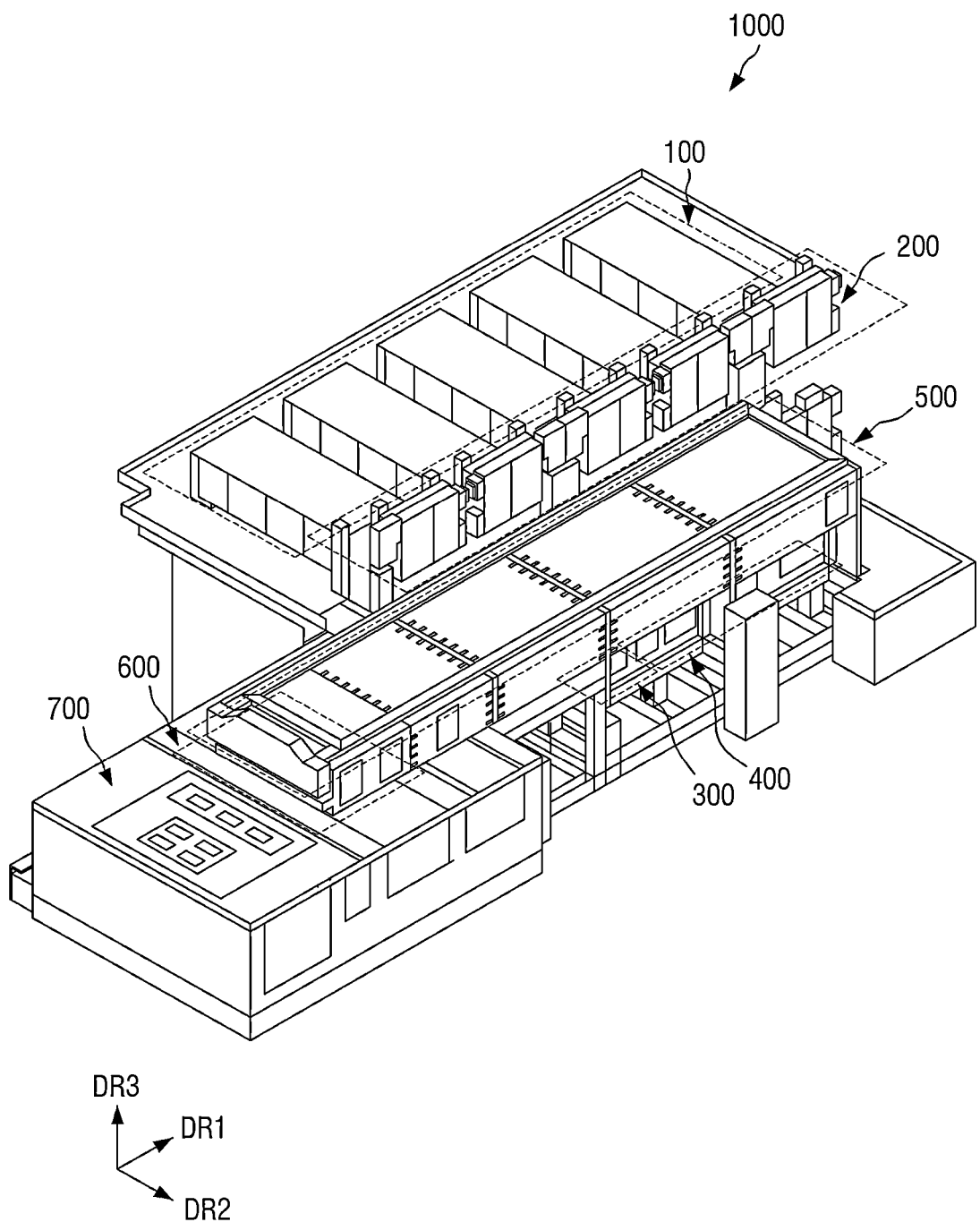
FIG. 6 is a perspective view showing an apparatus for manufacturing a display device according to an embodiment.

FIG. 5 is a schematic block diagram showing an apparatus for manufacturing a display device according to an embodiment. FIG. 6 is a perspective view showing an apparatus for manufacturing a display device according to an embodiment.

Referring to FIGS. 5 and 6, an embodiment of the display device manufacturing apparatus 1000 may be a solid-state laser annealing (SLA) apparatus. The solid-state laser annealing apparatus may have higher productivity, lower maintenance costs, and higher crystallization quality than an excimer laser annealing apparatus. The solid-state laser annealing apparatus refers to a laser device that uses a solid material as the medium for the laser, and the excimer laser annealing apparatus refers to a laser device that uses a gaseous material as the medium for the laser.

For example, unlike the excimer laser annealing apparatus, the solid-state laser annealing apparatus may be performed without gas filling, so that the display device manufacturing apparatus 1000 according to an embodiment may have high productivity and low maintenance costs due to no downtime for gas filling. The downtime refers to the time during which the crystallization process is not in progress.

In addition, the excimer laser annealing apparatus may be desired to operate in a state where the stage is tilted to prevent vertical mura, the scan interval is set to an integer multiple of the thin film transistor arrangement spacing to prevent diagonal mura that may occur as a result of tilting, and the stage is vector driven to minimize dead space caused by tilting. In an embodiment, the display device manufacturing apparatus 1000, which is a solid-state laser annealing apparatus, may be performed without complex equipment operations such as tilting the stage, setting the scan interval to an integer multiple, and vector driving the stage, thereby achieving high process efficiency and high crystallization quality.

In some embodiments, the display device manufacturing apparatus 1000 may use at least one selected from ytterbium yag (Yb:YAG), neodymium yag (Nd:YAG), ruby (Cr:Al$_2$O$_3$), and titanium sapphire (Ti:Sapphire) as the medium for the laser.

The display device manufacturing apparatus 1000 may include a laser module 100, a beam coupling module 200, a beam mixing unit 300, a micro smoother 400, an optical module 500, a seal box 600, and a chamber 700.

The laser module 100 may generate a plurality of raw laser beams RLB. The laser module 100 may include a plurality of laser generators. The laser module 100 may be a solid-state laser device that uses a solid material as a medium for the laser, as described above.

The beam coupling module 200 may be disposed at one side of the laser module 100. In an embodiment, for example, the beam coupling module 200 may be disposed at one side of the laser module 100 in a second direction DR2. The beam coupling module 200 may convert the plurality of raw laser beams RLB generated from the laser module 100 into a plurality of coupling beams CPB. The beam coupling module 200 may organize the plurality of raw laser beams RLB into one or several groups to form the plurality of coupling beams CPB.

In the specification and the drawings, a first direction DR1 and the second direction DR2 cross each other as horizontal directions. For example, the first direction DR1 and the second direction DR2 may be orthogonal to each other. In addition, the third direction DR3 crosses the first direction DR1 and the second direction DR2, and may be, for example, perpendicular directions orthogonal to each other. In the specification, directions indicated by arrows of the first to third directions DR1 to DR3 in the drawings may be referred to as one side, and the opposite directions thereto may be referred to as the other side. However, if one side or the other side is not specified, it may not be limited to either one side or the other side. The first to third directions DR1, DR2, and DR3 may be independent directions unrelated to the major axis direction Lx, the minor axis direction Ly, and the path direction Lz.

The beam mixing unit 300 may be disposed to one side of the beam coupling module 200. In an embodiment, for example, the beam mixing unit 300 may be disposed to one side of the beam coupling module 200 in the second direction DR2. The beam mixing unit 300 may convert the plurality of coupling beams CPB into a plurality of mixing beams MXB. In an embodiment, the beam mixing unit 300 may form the plurality of mixing beams MXB by mixing the plurality of coupling beams CPB at a certain ratio. In such an embodiment, the plurality of mixing beams MXB may each include a same amount of the raw laser beams RLB.

The micro smoother 400 may be disposed to one side of the beam mixing unit 300. In an embodiment, for example, the micro smoother 400 may be disposed at one side portion of the beam mixing unit 300 in the first direction DR1. The micro smoother 400 may be a device that produces regular or irregular wobbling of the laser beam. By intentionally causing the laser beam to wobble, the micro smoother 400 may effectively prevent horizontal mura that may occur during crystallization of the silicon thin film.

In an embodiment, for example, as described above with reference to FIG. 4A and the like, the final laser beam FLB may have a flat top type profile shape. However, when some uneven stepped portions occur in the flat top shape or there are particles or the like in the path of the laser beam, energy imbalance may occur in a portion of the laser beam due to the stepped portions, the particles, or the like. Accordingly, when the portion of the laser beam in which such energy imbalance has occurred is used to scan the substrate while irradiating a certain area of the substrate, horizontal mura may occur along the portion in which the imbalance has occurred. In the display device manufacturing apparatus 1000 according to an embodiment, the micro smoother 400 may offset the energy imbalance by creating intentional wobble in the laser beam. Accordingly, the occurrence of horizontal mura may be effectively prevented.

The optical module 500 may be disposed on the beam mixing unit 300 and the micro smoother 400. In an embodiment, for example, the optical module 500 may be disposed to one side of the beam mixing unit 300 and the micro smoother 400 in the third direction DR3. The optical module 500 may adjust the phase, travel distance, travel direction, and the like of the plurality of mixing beams MXB that have passed through the beam mixing unit 300. The optical module 500 may determine the shape of the final laser beam FLB by adjusting the phase, travel distance, travel direction, or the like of the plurality of mixing beams MXB. The optical module 500 may include at least one selected from a phase retarder, a lens, and a mirror.

The seal box 600 may be disposed between the optical module 500 and the chamber 700. In an embodiment, for example, the seal box 600 may be disposed between the optical module 500 and the chamber 700 in the third direction DR3. The seal box 600 may be a space for processing the final laser beam FLB before the final laser beam FLB is incident on the chamber 700.

The chamber 700 may be disposed below the optical module 500. In an embodiment, for example, the chamber 700 may be disposed at one side of the optical module 500 in a direction opposite to the third direction DR3. The chamber 700 may provide an internal space for performing an annealing process.

FIG. 7 is a perspective view showing a laser module according to an embodiment.

Referring to FIG. 7 in addition to FIGS. 5 and 6, an embodiment of the laser module 100 may include a plurality of laser generators. In an embodiment, for example, the laser module 100 may include a first laser generator 101, a second laser generator 102, a third laser generator 103, a fourth laser generator 104, a fifth laser generator 105, a sixth laser generator 106, a seventh laser generator 107, an eighth laser generator 108, a ninth laser generator 109, and a tenth laser generator 110. In the drawing, an embodiment where the laser module 100 includes ten laser generators is shown, but the number of laser generators included in the laser module 100 is not limited thereto. The number of laser generators included in the laser module 100 may vary depending on the total output power, oscillation frequency, process speed, or the like of the laser module 100.

The first to fifth laser generators 101 to 105 may be arranged side by side in the first direction DR1. The sixth to tenth laser generators 106 to 110 may be arranged side by side in the first direction DR1. The first laser generator 101 may be arranged side by side with the sixth laser generator 106 in the third direction DR3. The second laser generator 102 may be arranged side by side with the seventh laser generator 107 in the third direction DR3. The third laser generator 103 may be arranged side by side with the eighth laser generator 108 in the third direction DR3. The fourth laser generator 104 may be arranged side by side with the ninth laser generator 109 in the third direction DR3. The fifth laser generator 105 may be arranged side by side with the tenth laser generator 110 in the third direction DR3.

The laser module 100 may generate the raw laser beam RLB. In an embodiment, for example, the first laser generator 101 may generate a first raw laser beam RLB1, the second laser generator 102 may generate a second raw laser beam RLB2, the third laser generator 103 may generate a third raw laser beam RLB3, the fourth laser generator 104 may generate a fourth raw laser beam RLB4, the fifth laser generator 105 may generate a fifth raw laser beam RLB5, the sixth laser generator 106 may generate a sixth raw laser beam RLB6, the seventh laser generator 107 may generate a seventh raw laser beam RLB7, the eighth laser generator 108 may generate an eighth raw laser beam RLB8, the ninth laser generator 109 may generate a ninth raw laser beam RLB9, and the tenth laser generator 110 may generate a tenth raw laser beam RLB10.

The raw laser beam RLB may include at least one or more laser beams. In an embodiment, for example, the first to tenth raw laser beams RLB1 to RLB10 may each include two laser beams, but are not limited thereto.

The total output power of the laser module 100 may be in a range of about 5,760 watts (W) to about 9,000 watts (W). In an embodiment, for example, the total output power of the laser module 100 may be about 7200 W. The output power of each of the first to tenth laser generators 101 to 110 may be about 600 W to 900 W. Preferably, the output power of each of the first to tenth laser generators 101 to 110 may be about 720 W. The output power of each of the first to tenth laser generators 101 to 110 may be the same as each other, but the disclosure is not limited thereto. By increasing the number of laser generators and setting the output power of each laser generator to be about 1000 W or less, the display device manufacturing apparatus 1000 according to an embodiment may effectively prevent thermal deformation due to high energy accumulation in various optical components included in the display device manufacturing apparatus 1000, thereby increasing the lifespan.

The oscillation frequency of the laser module 100, e.g., the oscillation frequency of each of the first to tenth laser generators 101 to 110, may be in a range of about 5,000 hertz (Hz) to about 15,000 hertz (Hz). In an embodiment, for example, the oscillation frequency of each of the first to tenth laser generators 101 to 110 may be about 10,000 hertz (Hz). The display device manufacturing apparatus 1000 according to an embodiment may improve the efficiency and yield of the annealing process by using a laser with a high repetition rate. In such an embodiment, since the oscillation frequency of the laser module 100 is about 15,000 hertz (Hz) or less, thermal deformation due to high energy accumulation in various optical components included in the display device manufacturing apparatus 1000 may be effectively prevented, thereby increasing the lifespan.

The raw laser beam RLB may be a laser beam in the ultraviolet region. For example, the wavelength of the raw laser beam RLB may be in a range of about 337 nanometers (nm) to about 357 nm. In an embodiment, for example, the wavelength of the raw laser beam RLB may be in a range of about 341 nm to about 345 nm. The display device manufacturing apparatus 1000 according to an embodiment may have high transmittance by using the raw laser beam RLB in the ultraviolet region having a high wavelength. As a result, the depth of focus (DOF) may increase and thus uniform crystallization may be achieved.

Figure 8:
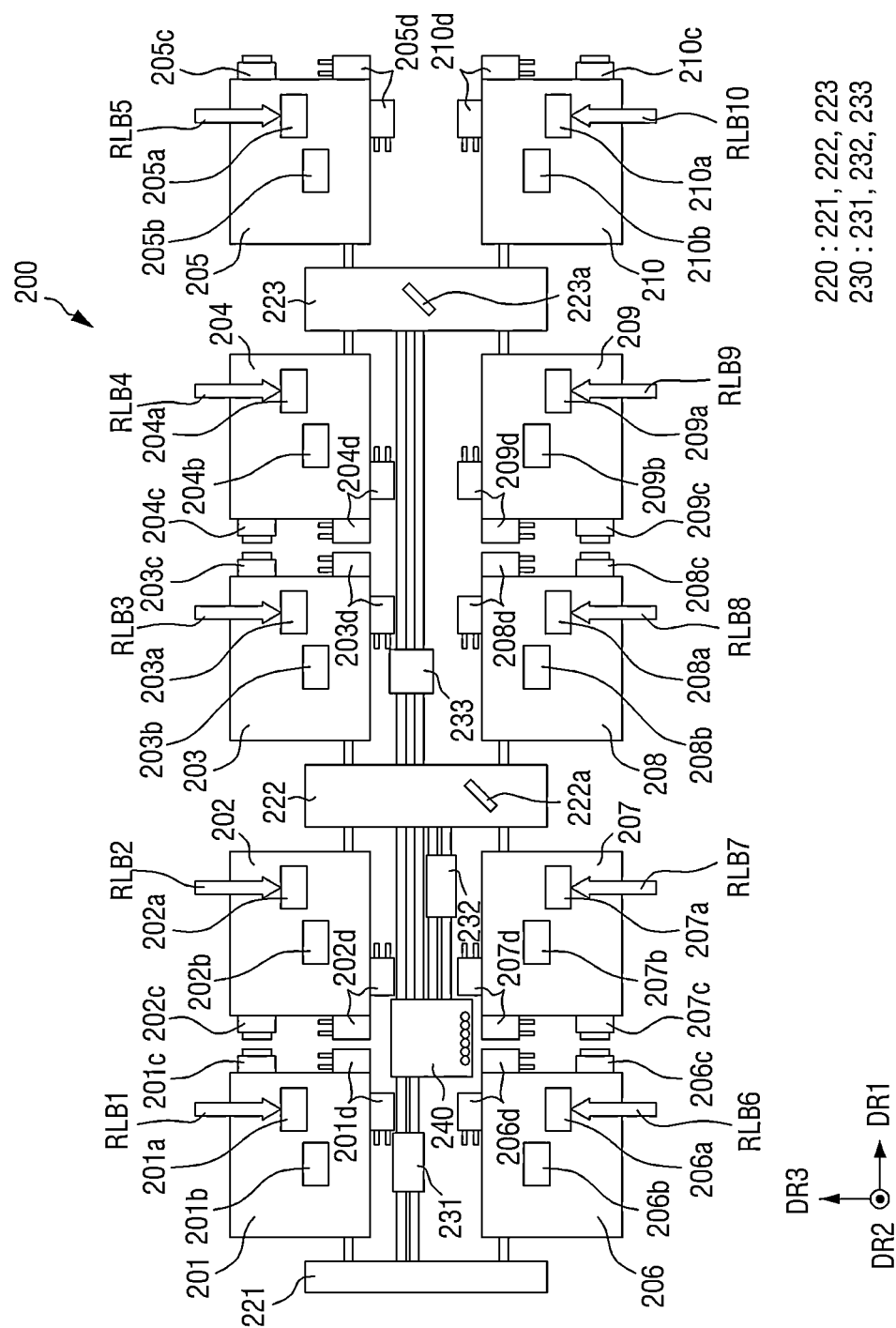
FIG. 8 is a cross-sectional view showing a beam coupling module according to an embodiment.
Figure 9:
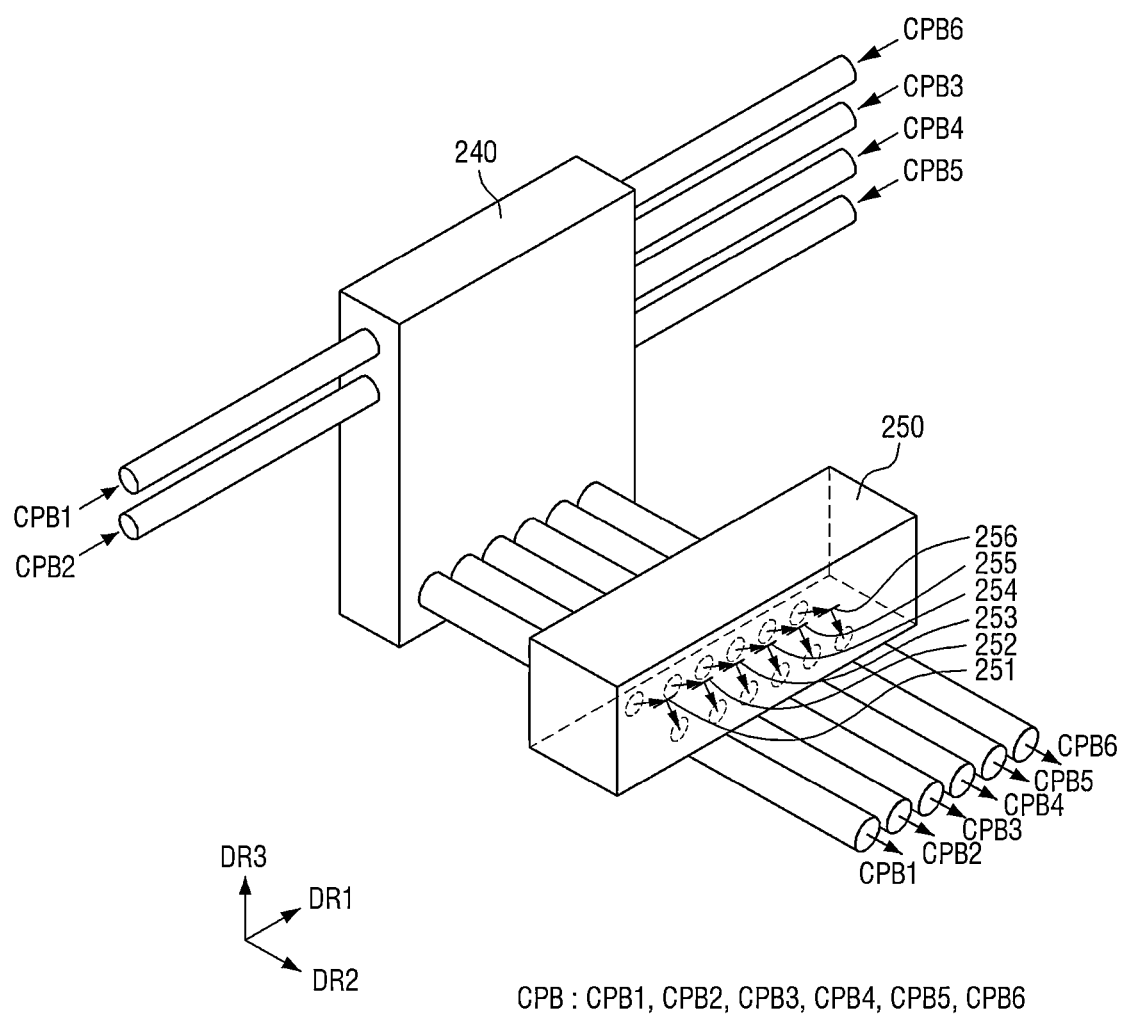
FIG. 9 is a perspective view illustrating a group coupling unit and a pulse extender module according to an embodiment.
Figure 10:
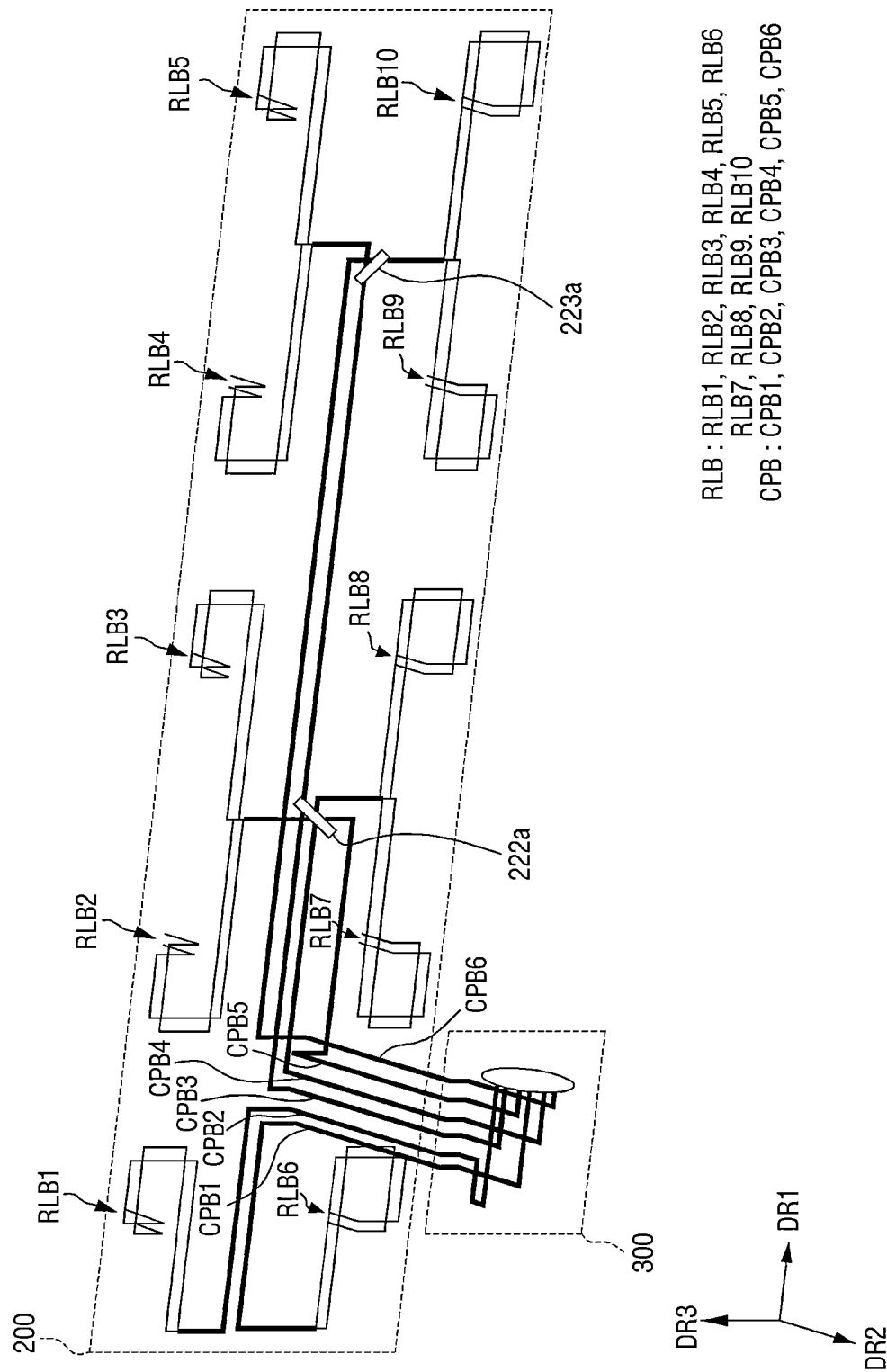
FIG. 10 is a schematic diagram showing paths of laser beams passing through a beam coupling module and a beam mixing unit according to an embodiment.

FIG. 8 is a cross-sectional view showing a beam coupling module according to an embodiment. FIG. 9 is a perspective view illustrating a group coupling unit and a pulse extender module according to an embodiment. FIG. 10 is a schematic diagram showing paths of laser beams passing through a beam coupling module and a beam mixing unit according to an embodiment.

Referring to FIGS. 8 to 10 in addition to FIGS. 5 and 6, the beam coupling module 200 may include a plurality of coupling module devices 201 to 210, at least one scraper unit 220, a group telescope unit 230, and a group coupling unit 240.

The beam coupling module 200 may include the plurality of coupling module devices. In an embodiment, for example, the beam coupling module 200 may include a first beam coupling module 201, a second beam coupling module 202, a third beam coupling module 203, a fourth beam coupling module 204, a fifth beam coupling module 205, a sixth beam coupling module 206, a seventh beam coupling module 207, an eighth beam coupling module 208, a ninth beam coupling module 209, and a tenth beam coupling module 210. In the drawing, an embodiment where the beam coupling module 200 includes ten beam coupling module devices is shown, but the number of the beam coupling modules 200 is not limited thereto. The number of the beam coupling modules 200 may vary depending on the number of the laser generators of the laser module 100.

The first to fifth beam coupling modules 201 to 205 may be arranged side by side in the first direction DR1. The sixth to tenth beam coupling modules 206 to 210 may be arranged side by side in the first direction DR1. The first beam coupling module 201 may be arranged side by side with the sixth beam coupling module 206 in the third direction DR3. The second beam coupling module 202 may be arranged side by side with the seventh beam coupling module 207 in the third direction DR3. The third beam coupling module 203 may be arranged side by side with the eighth beam coupling module 208 in the third direction DR3. The fourth beam coupling module 204 may be arranged side by side with the ninth beam coupling module 209 in the third direction DR3. The fifth beam coupling module 205 may be arranged side by side with the tenth beam coupling module 210 in the third direction DR3.

The first to tenth beam coupling modules 201 to 210 may be disposed at one side of the first to tenth laser generators 101 to 110 in the second direction DR2, respectively. The first to tenth beam coupling modules 201 to 210 may receive the first to tenth raw laser beams RLB1 to RLB10 from the first to tenth laser generators 101 to 110, respectively.

The first to tenth beam coupling modules 201 to 210 may each include at least one shutter 201a to 210a. In an embodiment, for example, the first beam coupling module 201 may include a first shutter 201a, the second beam coupling module 202 may include a second shutter 202a, the third beam coupling module 203 may include a third shutter 203a, the fourth beam coupling module 204 may include a fourth shutter 204a, the fifth beam coupling module 205 may include a fifth shutter 205a, the sixth beam coupling module 206 may include a sixth shutter 206a, the seventh beam coupling module 207 may include a seventh shutter 207a, the eighth beam coupling module 208 may include an eighth shutter 208a, the ninth beam coupling module 209 may include a ninth shutter 209a, and the tenth beam coupling module 210 may include a tenth shutter 210a.

The first to tenth shutters 201a to 210a may adjust the incidence of the first to tenth raw laser beams RLB1 to RLB10 into the first to tenth beam coupling modules 201 to 210, respectively. The shutter operation speed of the first to tenth shutters 201a to 210a may be in a range of about 20 milliseconds (ms) to about 500 milliseconds (ms). In an embodiment, for example, the shutter operation speed of the first to tenth shutters 201a to 210a may be in a range of about 20 milliseconds (ms) to about 100 milliseconds (ms).

The first to tenth beam coupling modules 201 to 210 may each include at least one high-speed photodiode 201b to 210b, at least one low-speed photodiode 201c to 210c, and at least one single beam monitor 201d to 210d. In an embodiment, for example, the first beam coupling module 201 may include a first high-speed photodiode 201b, a first low-speed photodiode 201c, and a first single beam monitor 201d. The second beam coupling module 202 may include a second high-speed photodiode 202b, a second low-speed photodiode 202c, and a second single beam monitor 202d. The third beam coupling module 203 may include a third high-speed photodiode 203b, a third low-speed photodiode 203c, and a third single beam monitor 203d. The fourth beam coupling module 204 may include a fourth high-speed photodiode 204b, a fourth low-speed photodiode 204c, and a fourth single beam monitor 204d. The fifth beam coupling module 205 may include a fifth high-speed photodiode 205b, a fifth low-speed photodiode 205c, and a fifth single beam monitor 205d. The sixth beam coupling module 206 may include a sixth high-speed photodiode 206b, a sixth low-speed photodiode 206c, and a sixth single beam monitor 206d. The seventh beam coupling module 207 may include a seventh high-speed photodiode 207b, a seventh low-speed photodiode 207c, and a seventh single beam monitor 207d. The eighth beam coupling module 208 may include an eighth high-speed photodiode 208b, an eighth low-speed photodiode 208c, and an eighth single beam monitor 208d. The ninth beam coupling module 209 may include a ninth high-speed photodiode 209b, a ninth low-speed photodiode 209c, and a ninth single beam monitor 209d. The tenth beam coupling module 210 may include a tenth high-speed photodiode 210b, a tenth low-speed photodiode 210c, and a tenth single beam monitor 210d.

The high-speed photodiodes 201b to 210b, the low-speed photodiodes 201c to 210c, and the single beam monitors 201d to 210d may be configured to monitor the state of the raw laser beam RLB. In an embodiment, for example, the high-speed photodiodes 201b to 210b may monitor the pulse shape of the raw laser beam RLB, the low-speed photodiodes 201c to 210c may monitor the peak power of the raw laser beam RLB, and the single beam monitors 201d to 210d may monitor other characteristics, such as pulse duration and wavelength, of the raw laser beam RLB.

The scraper unit 220 may group each of the first to tenth raw laser beams RLB provided from the first to tenth beam coupling modules 201 to 210 to form the coupling beam CPB. The scraper unit 220 may include a first scraper unit 221, a second scraper unit 222, and a third scraper unit 223.

The first scraper unit 221 may be connected to the first beam coupling module 201 and the sixth beam coupling module 206. The second scraper unit 222 may be connected to the second beam coupling module 202, the third beam coupling module 203, the seventh beam coupling module 207, and the eighth beam coupling module 208. The third scraper unit 223 may be connected to the fourth beam coupling module 204, the fifth beam coupling module 205, the ninth beam coupling module 209, and the tenth beam coupling module 210.

The first scraper unit 221 may use the first raw laser beam RLB1 to generate a first coupling beam CPB1. The first scraper unit 221 may use the sixth raw laser beam RLB6 to generate a second coupling beam CPB2. The second scraper unit 222 may use the second raw laser beam RLB2, the third raw laser beam RLB3, the seventh raw laser beam RLB7, and the eighth raw laser beam RLB8 to generate a fourth coupling beam CPB4 and a fifth coupling beam CPB5. The third scraper unit 223 may use the fourth raw laser beam RLB4, the fifth raw laser beam RLB5, the ninth raw laser beam RLB9, and the tenth raw laser beam RLB10 to generate a third coupling beam CPB3 and a sixth coupling beam CPB6.

The second scraper unit 222 may include a first pre-mixer 222a, and the third scraper unit 223 may include a second pre-mixer 223a. The first and second pre-mixers 222a and 223a may be optical devices that transmit and reflect incident laser beams at a 1:1 ratio. The second scraper unit 222 and the third scraper unit 223 may generate the coupling beams CPB by grouping the plurality of raw laser beams RLB using the first pre-mixer 222a and the second pre-mixer 223a, respectively.

The group telescope unit 230 may adjust the degree of diffusion of the coupling beam CPB incident on the group telescope unit 230. In an embodiment, for example, the group telescope unit 230 may adjust the degree of diffusion of each laser beam included in the coupling beam CPB to provide the coupling beam CPB to the group coupling unit 240.

The telescope unit 230 may include a first telescope unit 231, a second telescope unit 232, and a third telescope unit 233. The first telescope unit 231 may connect the first scraper unit 221 to the group coupling unit 240. The second telescope unit 232 may connect the second scraper unit 222 to the group coupling unit 240. The third telescope unit 233 may connect the third scraper unit 223 to the group coupling unit 240.

The group coupling unit 240 may provide the coupling beam CPB to the beam mixing unit 300. In an embodiment, for example, the group coupling unit 240 may change the path of the coupling beam CPB traveling in the first direction DR1 to the second direction DR2. The coupling beam CPB whose path has been changed by the group coupling unit 240 may move to the beam mixing unit 300.

In some embodiments, the beam coupling module 200 may further include a pulse extender module (an optical pulse duration extender module (OPDEM)) 250.

The pulse extender module 250 may be disposed between the group coupling unit 240 and the beam mixing unit 300. The pulse extender module 250 may extend the pulse duration of the final laser beam FLB.

In an embodiment, for example, the pulse extender module 250 may adjust the time at which each coupling beam CPB is incident on the beam mixing unit 300 by controlling the movement path and travel direction of the coupling beam CPB. In one example, the pulse extender module 250 may include first to sixth beam path adjusters 251, 252, 253, 254, 255, and 256 that adjust the movement paths and travel directions of the first to sixth coupling beams CPB1 to CPB6, respectively. The first to sixth beam path adjusters 251, 252, 253, 254, 255, and 256 may include at least one selected from a phase retarder, a lens, and a mirror.

Figure 11:
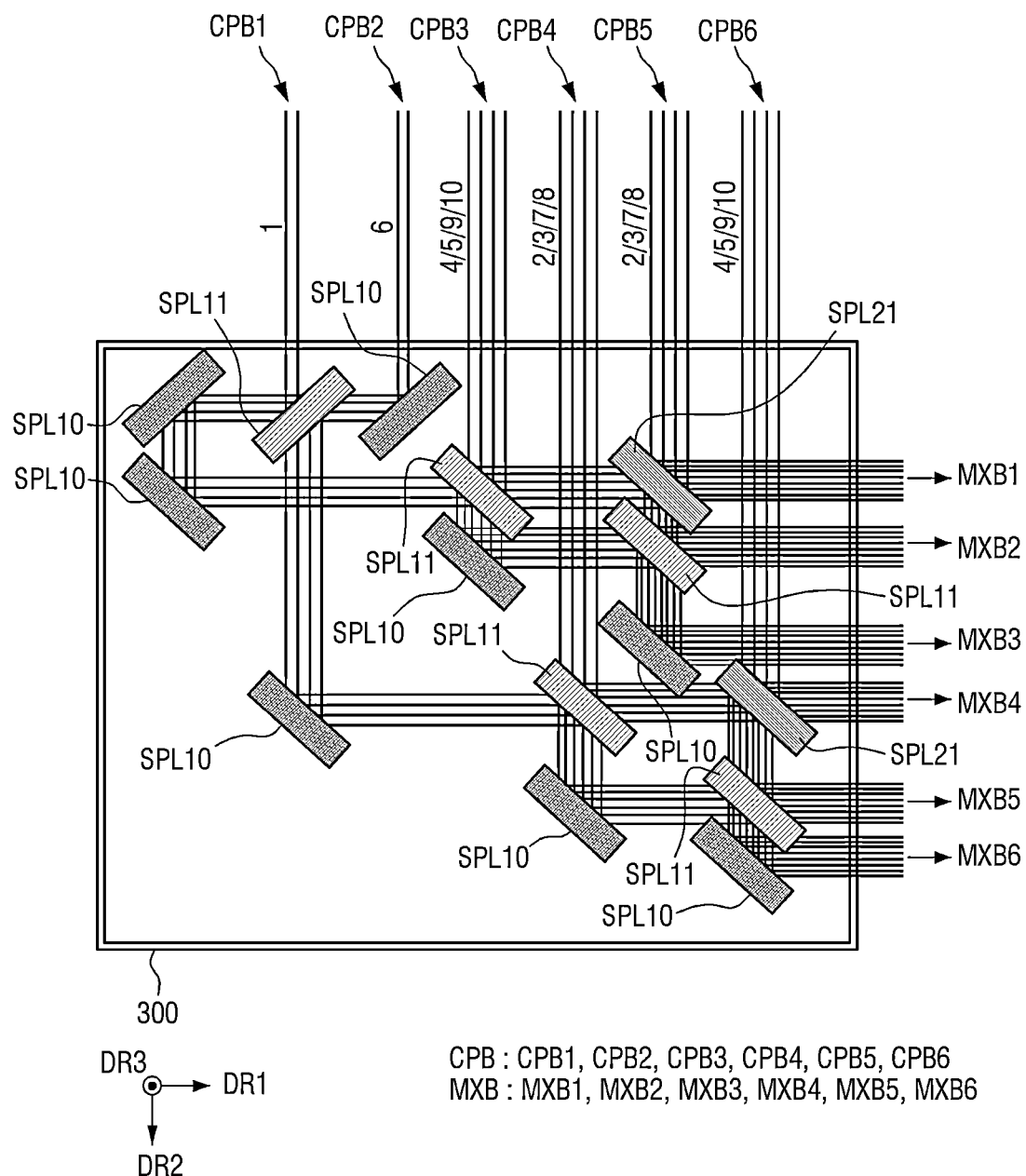
FIG. 11 is a schematic diagram showing the path of laser beams passing through a beam mixing unit according to an embodiment.

The pulse shape and pulse duration of the final laser beam FLB may be determined by the combination of the mixing beams MXB (see FIG. 11). Since the mixing beam MXB is generated using the coupling beam CPB, the pulse duration of the final laser beam FLB may be extended by adjusting the time at which each coupling beam CPB is incident on the beam mixing unit 300.

For example, if the time for the first coupling beam CPB1 to depart from the group coupling unit 240, pass through the first beam path adjuster 251, and arrive at the beam mixing unit 300 is shorter than the time for the second coupling beam CPB2 to depart from the group coupling unit 240, pass through the second beam path adjuster 252, and arrive at the beam mixing unit 300, the first coupling beam CPB1 and the second coupling beam CPB2 may form the final laser beam FLB having lower energy and a longer pulse duration through mutual reinforcement/cancellation interference. If the arrival times of the first coupling beam CPB1 and the second coupling beam CPB2 are the same as each other, the final laser beam FLB having higher energy may be formed without increasing the pulse duration.

The display device manufacturing apparatus 1000 according to an embodiment may freely or efficiently adjust the pulse duration and energy intensity of the final laser beam FLB by including the pulse extender module 250. Accordingly, various pulse shapes of the final laser beam FLB may be implemented.

In an embodiment, the pulse duration of the final laser beam FLB by the pulse extender module 250 may be in a range of about 14 nanoseconds (ns) to about 20 nanoseconds (ns).

Figure 12:
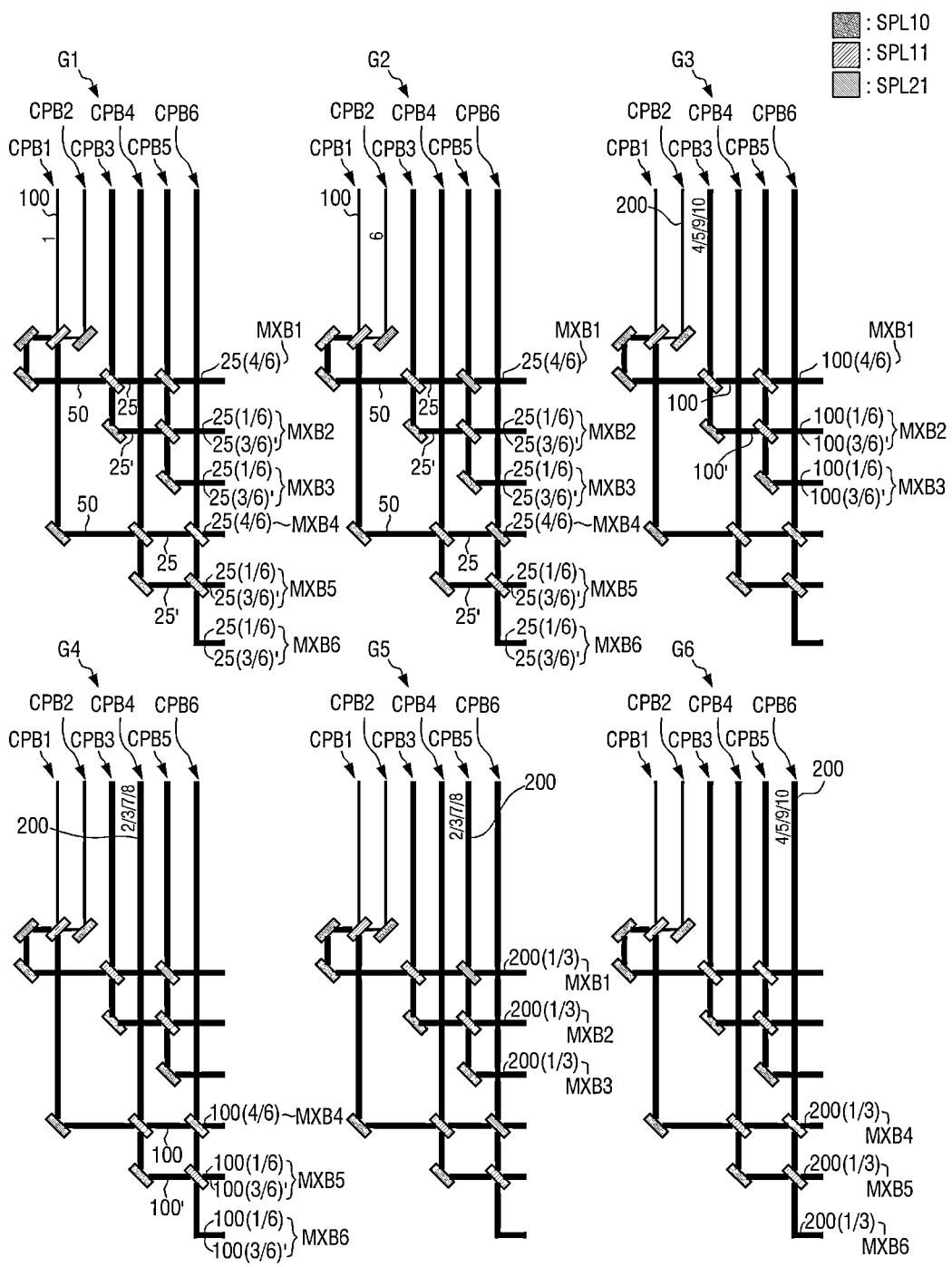
FIG. 12 is a schematic diagram showing a process in which each coupling beam is distributed into a mixing beam in a beam mixing unit according to an embodiment.

FIG. 11 is a schematic diagram showing the path of laser beams passing through a beam mixing unit according to an embodiment. FIG. 12 is a schematic diagram showing a process in which each coupling beam is distributed into a mixing beam in a beam mixing unit according to an embodiment.

Referring to FIGS. 11 and 12 in addition to FIGS. 5, 6, 8, and 10, an embodiment of the beam mixing unit 300 may mix the plurality of coupling beams CPB to generate the plurality of mixing beams MXB. In an embodiment, for example, the beam mixing unit 300 may mix the plurality of coupling beams CPB at various ratios to generate first to sixth mixing beams MXB1, MXB2, MXB3, MXB4, MXB5, and MXB6.

The first to sixth mixing beams MXB1, MXB2, MXB3, MXB4, MXB5, and MXB6 may have substantially the same energy intensity as each other. The display device manufacturing apparatus 1000 according to an embodiment may generate the first to sixth mixing beams MXB1, MXB2, MXB3, MXB4, MXB5, and MXB6 of the same energy using the beam mixing unit 300 to form the final laser beam FLB having uniform energy. Accordingly, it is possible to effectively prevent the vertical mura phenomenon that may occur in the silicon thin film during the annealing process.

The beam mixing unit 300 may include a reflection mirror SPL10, a first splitter SPL11, and a second splitter SPL21. The beam mixing unit 300 may generate the first to sixth mixing beams MXB1, MXB2, MXB3, MXB4, MXB5, and MXB6 having the same energy by adjusting the energy and paths of the coupling beams CPB incident on the reflection mirror SPL10, the first splitter SPL11, and the second splitter SPL21.

The reflection mirror SPL10 may change the path of the coupling beam CPB without changing energy by reflecting the incident coupling beam CPB.

The first splitter SPL11 may transmit and reflect the incident coupling beam CPB at a ratio of 1:1. The ratio of the energy intensity of the transmitted coupling beam CPB and the reflected coupling beam CPB at the first splitter SPL11 may be 1:1.

The second splitter SPL21 may transmit and reflect the incident coupling beam CPB at a ratio of 2:1. The ratio of the energy intensity of the transmitted coupling beam CPB and the reflected coupling beam CPB at the second splitter SPL21 may be 2:1.

In an embodiment, for example, when the initial energy intensity of each of the first to tenth raw laser beams RLB1 to RLB10 is 100, the first coupling beam CPB1 and the second coupling beam CPB2 may be generated using the first raw laser beam RLB1 and the sixth raw laser beam RLB6, respectively, so that the energy intensity of the first coupling beam CPB1 and the second coupling beam CPB2 may each be 100. Since the third coupling beam CPB3 and the sixth coupling beam CPB6 are generated using the fourth raw laser beam RLB4, the fifth raw laser beam RLB5, the ninth raw laser beam RLB9, and the tenth raw laser beam RLB10, the energy intensity of the third coupling beam CPB3 and the sixth coupling beam CPB6 may each be 200. Since the fourth coupling beam CPB4 and the fifth coupling beam CPB5 are generated using the second raw laser beam RLB2, the third raw laser beam RLB3, the seventh raw laser beam RLB7, and the eighth raw laser beam RLB8, the energy intensity of the fourth coupling beam CPB4 and the fifth coupling beam CPB5 may each be 200.

First, as shown in first schematic diagram G1 of FIG. 12, the first coupling beam CPB1 having an energy of 100 may be split into two laser beams each having an energy of 50 through the first splitter SPL11 in first position. The laser beams each having an energy of 50 may each be split into two laser beams each having an energy of 25 and two laser beams each having an energy of 25' through the first splitter SPL11 in second position.

In this specification and drawings, the distinction between the energy of 25 and the energy of 25' is made merely for simplicity of description, but they refer to energy of the same intensity. In the following, an energy of 100 and an energy of 100' are the same.

The laser beam having an energy of 25 may be split into a laser beam having an energy of 25 (4/6) and a laser beam having an energy of 25 (2/6) through the second splitter SPL21. The laser beam having an energy of 25 (2/6) may be split into two laser beams each having an energy of 25 (1/6) through the first splitter SPL11 in third position.

The laser beam having an energy of 25' may be split into two laser beams each having an energy of 25 (3/6)' through the first splitter SPL11 in third position.

The laser beam having an energy of 25 (4/6) may be included in the first mixing beam MXB1 and the fourth mixing beam MXB4. The laser beam having an energy of 25 (1/6) and the laser beam having an energy of 25 (3/6)' may be combined with each other and included in the second mixing beam MXB2, the third mixing beam MXB3, the fifth mixing beam MXB5, and the sixth mixing beam MXB6.

As a result, each of the first to sixth mixing beams MXB1, MXB2, MXB3, MXB4, MXB5, and MXB6 may be equally provided with an energy of 25 (4/6) from the first raw laser beam RLB1.

Next, as shown in second schematic diagram G2 of FIG. 12, the second coupling beam CPB2 having an energy of 100 may also be divided in the same manner as the first coupling beam CPB1 to form the first to sixth mixing beams MXB1, MXB2, MXB3, MXB4, MXB5, and MXB6.

As a result, each of the first to sixth mixing beams MXB1, MXB2, MXB3, MXB4, MXB5, and MXB6 may be equally provided with an energy of 25 (4/6) from the sixth raw laser beam RLB6.

Next, as shown in third schematic diagram G3 of FIG. 12, the third coupling beam CPB3 having an energy of 200 may be split into a laser beam having an energy of 100 and a laser beam having an energy of 100' through the first splitter SPL11 in first position.

The laser beam having an energy of 100 may be split into a laser beam having an energy of 100 (4/6) and a laser beam having an energy of 100 (2/6) through the second splitter SPL21. The laser beam having an energy of 100 (2/6) may be split into two laser beams each having an energy of 100 (1/6) through the first splitter SPL11 in second position.

The laser beam having an energy of 100' may be divided into two laser beams each having an energy of 100 (3/6)' through the first splitter SPL11 in second position.

The laser beam having an energy of 100 (4/6) may be included in the first mixing beam MXB1. The laser beam having an energy of 100 (1/6) and the laser beam having an energy of 100 (3/6)' may be combined with each other and included in the second mixing beam MXB2 and the third mixing beam MXB3.

Next, as shown in sixth schematic diagram G6 of FIG. 12, the sixth coupling beam CPB6 having an energy of 200 may be split into a laser beam having an energy of 200 (1/3) and a laser beam having an energy of 200 (2/3) through the second splitter SPL21.

The laser beam having an energy of 200 (2/3) may be split into two laser beams each having an energy of 200 (1/3) through the first splitter SPL11.

The laser beam having an energy of 200 1/3 may be included in the fourth mixing beam MXB4, the fifth mixing beam MXB5, and the sixth mixing beam MXB6.

As a result, each of the first to sixth mixing beams MXB1, MXB2, MXB3, MXB4, MXB5, and MXB6 may be equally provided with an energy of 100 (4/6) from the fourth raw laser beam RLB4, the fifth raw laser beam RLB5, the ninth raw laser beam RLB9, and the tenth raw laser beam RLB10. That is, the first to sixth mixing beams MXB1, MXB2, MXB3, MXB4, MXB5, and MXB6 may each be provided with an energy of 25 (4/6) from the fourth raw laser beam RLB4, an energy of 25 (4/6) from the fifth raw laser beam RLB5, an energy of 25 (4/6) from the ninth raw laser beam RLB9, and an energy of 25 (4/6) from the tenth raw laser beam RLB10.

Next, as shown in fourth schematic diagram G4 of FIG. 12, the fourth coupling beam CPB4 having an energy of 200 may be split into a laser beam having an energy of 100 and a laser beam having an energy of 100' through the first splitter SPL11 in first position.

The laser beam having an energy of 100 may be split into a laser beam having an energy of 100 (4/6) and a laser beam having an energy of 100 (2/6) through the second splitter SPL21. The laser beam having an energy of 100 (2/6) may be split into two laser beams each having an energy of 100 (1/6) through the first splitter SPL11 in second position.

The laser beam having an energy of 100' may be split into two laser beams each having an energy of 100 (3/6)' through the first splitter SPL11 in second position.

The laser beam having an energy of 100 (4/6) may be included in the fourth mixing beam MXB4. The laser beam having an energy of 100 (1/6) and the laser beam having an energy of 100 (3/6)' may be combined with each other and included in the fifth mixing beam MXB5 and the sixth mixing beam MXB6.

Next, as shown in fifth schematic diagram G5 of FIG. 12, the fifth coupling beam CPB5 having an energy of 200 may be split into a laser beam having an energy of 200 (1/3) and a laser beam having an energy of 200 (2/3) through the second splitter SPL21.

The laser beam having an energy of 200 (2/3) may be split into two laser beams each having an energy of 200 (1/3) through the first splitter SPL11.

The laser beam having an energy of 200 (1/3) may be included in the first mixing beam MXB1, the second mixing beam MXB2, and the third mixing beam MXB3.

As a result, each of the first to sixth mixing beams MXB1, MXB2, MXB3, MXB4, MXB5, and MXB6 may be equally provided with an energy of 100 (4/6) from the second raw laser beam RLB2, the third raw laser beam RLB3, the seventh raw laser beam RLB7, and the eighth raw laser beam RLB8. In such an embodiment, as described above, each of the first to sixth mixing beams MXB1, MXB2, MXB3, MXB4, MXB5, and MXB6 may be provided with an energy of 25 (4/6) from the second raw laser beam RLB2, an energy of 25 (4/6) from the third raw laser beam RLB3, an energy of 25 (4/6) from the seventh raw laser beam RLB7, and an energy of 25 (4/6) from the eighth raw laser beam RLB8.

In such an embodiment, as shown in first to sixth schematic diagrams G1 to G6, the first to sixth mixing beams MXB1, MXB2, MXB3, MXB4, MXB5, and MXB6 may each receive an energy of 25 (4/6) equally from the first to tenth raw laser beams RLB1 to RLB10. Accordingly, the first to sixth mixing beams MXB1, MXB2, MXB3, MXB4, MXB5, and MXB6 may have substantially the same energy intensity. The display device manufacturing apparatus 1000 according to an embodiment may generate the first to sixth mixing beams MXB1, MXB2, MXB3, MXB4, MXB5, and MXB6 having a same energy using the beam mixing unit 300 to form the final laser beam FLB having uniform energy. Accordingly, it is possible to effectively prevent the vertical mura phenomenon that may occur in the silicon thin film during the annealing process.

In the display device manufacturing apparatus 1000 according to thane embodiment, it is desired for the first to sixth mixing beams MXB1, MXB2, MXB3, MXB4, MXB5, and MXB6 to have a same intensity of energy, and also to uniformly include the first to tenth raw laser beams RLB1 to RLB10 by the same amount of energy.

Figure 13:
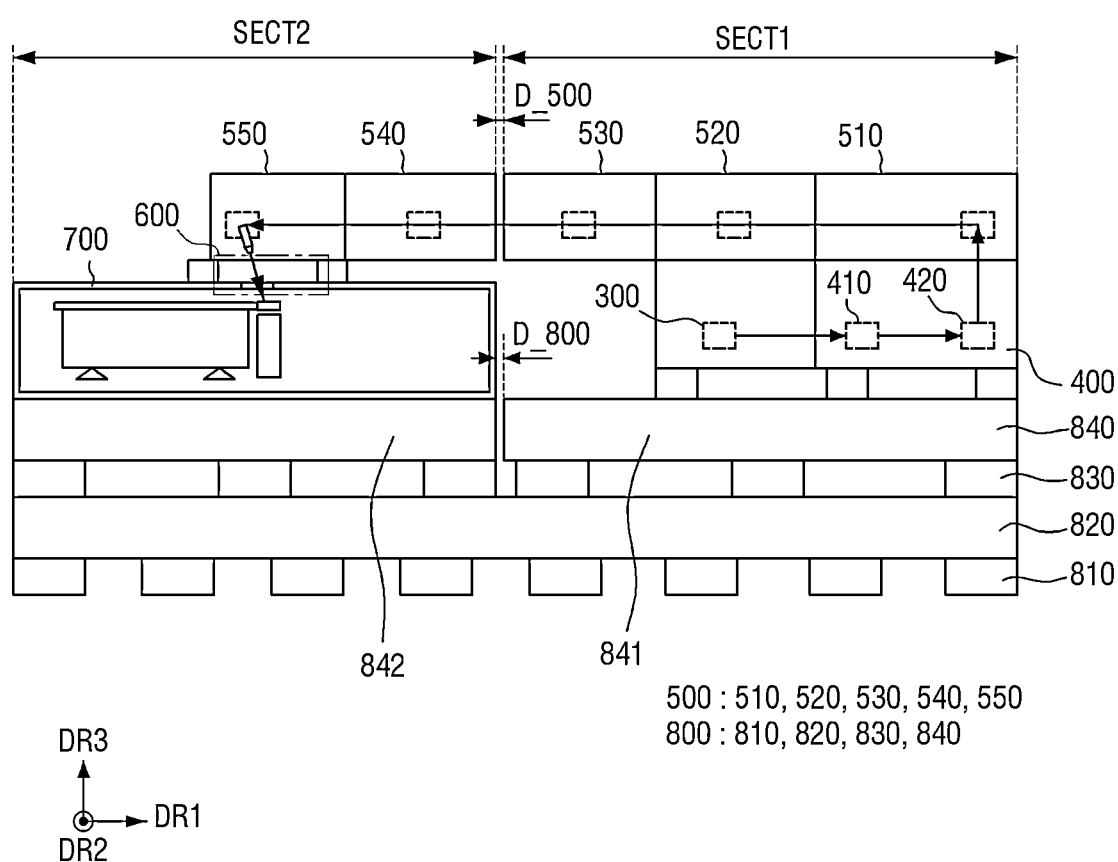
FIG. 13 is a cross-sectional view illustrating a beam mixing unit, a micro smoother, an optical module, a seal box, a chamber, and a basic frame according to an embodiment.

FIG. 13 is a cross-sectional view illustrating a beam mixing unit, a micro smoother, an optical module, a seal box, a chamber, and a basic frame according to an embodiment. FIG. 14 is a perspective view illustrating the beam mixing unit, the micro smoother, and the optical module according to an embodiment.

Referring to FIGS. 13 and 14 in addition to FIGS. 5 and 6, in an embodiment, the mixing beam MXB generated in the beam mixing unit 300 may reach the target substrate 10 through the micro smoother 400, the optical module 500, the seal box 600, and the chamber 700.

The micro smoother 400 may be disposed on one side of the beam mixing unit 300. In an embodiment, for example, the micro smoother 400 may be disposed on one side of the beam mixing unit 300 in the first direction DR1. The micro smoother 400 may include a first micro smoother 410 and a second micro smoother 420. The micro smoother 400 will be described later with reference to FIGS. 15 and 16.

The optical module 500 may be disposed on the beam mixing unit 300 and the micro smoother 400. In an embodiment, for example, the optical module 500 may be disposed on one side of the beam mixing unit 300 and the micro smoother 400 in the third direction DR3. The optical module 500 may include at least one selected from at least one phase retarder, a lens, and a mirror. The optical module 500 may adjust the movement path and traveling direction of the laser beam. The optical module 500 may provide the laser beam provided from the micro smoother 400 to the chamber 700.

The optical module 500 may include a first optical module 510, a second optical module 520, a third optical module 530, a fourth optical module 540, and a fifth optical module 550.

The first optical module 510 may be disposed on the micro smoother 400. The second optical module 520 may be disposed on the beam mixing unit 300. The fourth optical module 540 and the fifth optical module 550 may be disposed on the chamber 700. The third optical module 530 may be disposed between the second optical module 520 and the fourth optical module 540.

The first to third optical modules 510, 520, and 530 may be disposed in a first sector SECT1. The fourth and fifth optical modules 540 and 550 may be disposed in a second sector SECT2. The second sector SECT2 may be an area in which the chamber 700 is disposed, and the first sector SECT1 may be an area disposed on one side of the second sector SECT2 and may be an area in which the chamber 700 is not disposed.

In some embodiments, the third optical module 530 and the fourth optical module 540 may be disposed to be spaced apart from each other. in an embodiment, for example, the third optical module 530 and the fourth optical module 540 may be disposed to be spaced apart from each other by a predetermined distance D_500 in the first direction DR1. In another embodiment, all the first to fifth optical modules 510, 520, 530, 540, and 550 may be disposed to be spaced apart.

In the display device manufacturing apparatus 1000 according to an embodiment, the third optical module 530 and the fourth optical module 540 may be disposed to be spaced apart from each other, such that the transfer of vibration occurring in the first sector SECT1 to the second sector SECT2 may be substantially reduced or minimized.

In some embodiments, although not illustrated in the drawings, the display device manufacturing apparatus 1000 may further include a wave plate.

The wave plate may be disposed between the beam mixing unit 300 and the optical module 500. In an embodiment, for example, the wave plate may be disposed between the beam mixing unit 300 and the first micro smoother 410, between the first micro smoother 410 and the second micro smoother 420, or between the second micro smoother 420 and the optical module 500.

In some embodiments, the wave plates may be disposed in paths of first to sixth mixing beams MXB1, MXB2, MXB3, MXB4, MXB5, and MXB6, respectively. In such embodiments, the number of wave plates may be 6, but is not limited thereto, and the number of wave plates may be less or more than the number of first to sixth mixing beams MXB1, MXB2, MXB3, MXB4, MXB5, and MXB6.

The wave plate may adjust the degree of polarization of the final laser beam FLB by adjusting the degree of polarization of the mixing beam MXB. In an embodiment, for example, the wave plate may cause at least one selected from the first to sixth mixing beams MXB1, MXB2, MXB3, MXB4, MXB5, and MXB6 to be S-polarized (vertically polarized) and the rest to be P-polarized (horizontally polarized). In an embodiment, for example, the wave plate may cause three of the first to sixth mixing beams MXB1, MXB2, MXB3, MXB4, MXB5, and MXB6 to be S-polarized and the remaining three thereof to be P-polarized.

By including the wave plate, the display device manufacturing apparatus 1000 according to an embodiment may evenly include an S-polarized beam and a P-polarized beam in the final laser beam FLB. Accordingly, the extension directions of the annealed silicon thin film particles are evenly distributed in the major axis direction Lx and the minor axis direction Ly, such that the reliability of the silicon thin film may be improved.

The seal box 600 may be disposed below the optical module 500. The chamber 700 may be disposed below the seal box 600. The seal box 600 and chamber 700 will be described later with reference to FIGS. 17 to 20.

The display device manufacturing apparatus 1000 according to an embodiment may further include a basic frame 800.

The basic frame 800 may include a first stage frame 810, a second stage frame 820, a third stage frame 830, and a fourth stage frame 840.

The first stage frame 810 may include a plurality of pedestals. The plurality of pedestals of the first stage frame 810 may be disposed to be spaced apart along the first direction DR1. However, the disclosure is not limited thereto, and the plurality of pedestals of the first stage frame 810 may be disposed to be spaced apart along the second direction DR2. Since the first stage frame 810 includes the plurality of pedestals spaced apart from each other, vibration transfer between parts may be substantially reduced or minimized.

The second stage frame 820 may be disposed on the first stage frame 810. The second stage frame 820 may include an integrally formed pedestal, that is, a pedestal integrally formed as a single unitary and indivisible part. Since the first stage frame 810 includes an integrally formed pedestal, the load of the equipment disposed on top may be distributed.

The third stage frame 830 may be disposed on the second stage frame 820. The third stage frame 830 may include a plurality of pedestals. The plurality of pedestals of the third stage frame 830 may be disposed to be spaced apart along the first direction DR1. However, the disclosure is not limited thereto, and the plurality of pedestals of the third stage frame 830 may be disposed to be spaced apart along the second direction DR2. Since the third stage frame 830 includes the plurality of pedestals spaced apart from each other, the vibration transfer between parts may be substantially reduced or minimized.

In some embodiments, although not illustrated in the drawings, the extension direction of the plurality of pedestals of the first stage frame 810 and the extension direction of the plurality of pedestals of the third stage frame 830 may be different from each other. In an embodiment, for example, the extension direction of the plurality of pedestals of the first stage frame 810 may be in the first direction DR1, and the extension direction of the plurality of pedestals of the third stage frame 830 may be in the second direction DR2. In another embodiment, for example, the extension direction of the plurality of pedestals of the first stage frame 810 may be in the second direction DR2, and the extension direction of the plurality of pedestals of the third stage frame 830 may be in the first direction DR1. In the basic frame 800 according to an embodiment, the extension direction of the plurality of pedestals of the first stage frame 810 and the extension direction of the plurality of pedestals of the third stage frame 830 may be disposed differently from each other, such that the load of the equipment disposed on top may be distributed.

The fourth stage frame 840 may be disposed on the third stage frame 830. The fourth stage frame 840 may include a first pedestal 841 and a second pedestal 842. The first pedestal 841 may be disposed in the first sector SECT1, and the second pedestal 842 may be disposed in the second sector SECT2.

The first pedestal 841 may support the beam mixing unit 300, the micro smoother 400, the first optical module 510, the second optical module 520, and the third optical module 530. In an embodiment, for example, the first pedestal 841 may overlap the beam mixing unit 300, the micro smoother 400, the first optical module 510, the second optical module 520, and the third optical module 530 in the third direction DR3.

The second pedestal 842 may support the fourth optical module 540, the fifth optical module 550, the seal box 600, and the chamber 700. In an embodiment, for example, the second pedestal 842 may overlap the fourth optical module 540, the fifth optical module 550, the seal box 600, and the chamber 700 in the third direction DR3.

The first pedestal 841 and the second pedestal 842 may be disposed to be spaced apart from each other. In an embodiment, for example, the first pedestal 841 and the second pedestal 842 may be disposed to be spaced apart from each other by a predetermined distance D_800 in the first direction DR1.

In the display device manufacturing apparatus 1000 according to an embodiment, the first pedestal 841 and the second pedestal 842 may be disposed to be spaced apart from each other, such that the transfer of vibration occurring in the equipment, vibration occurring around the equipment, or the like may be substantially reduced or minimized.

Figure 15:
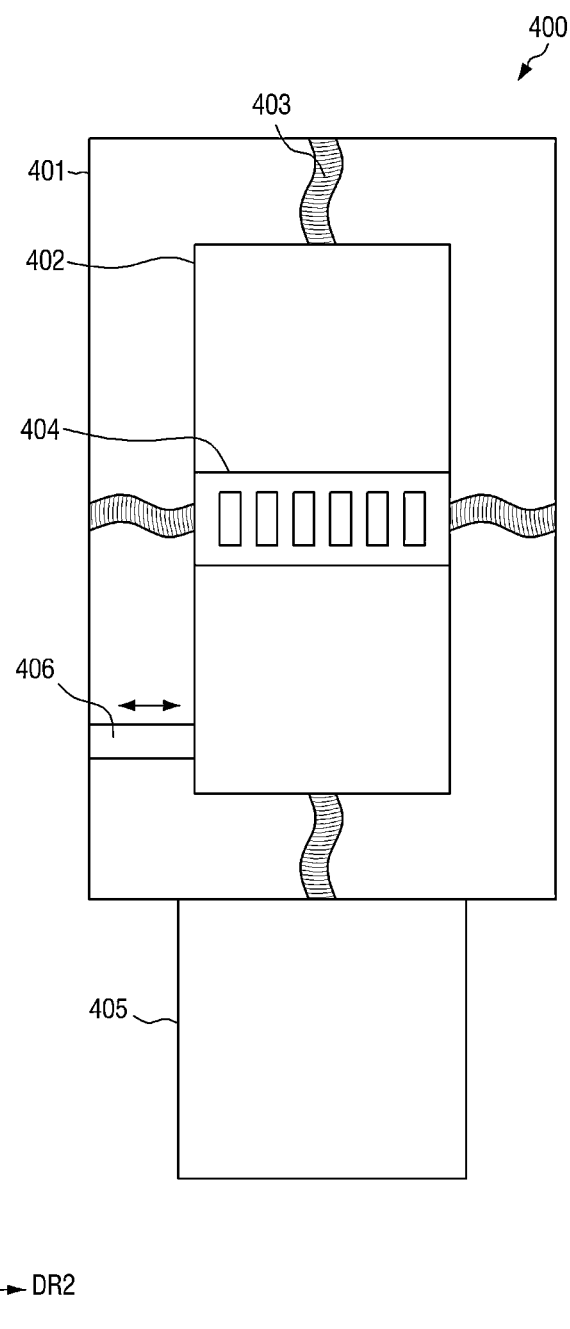
FIG. 15 is a cross-sectional view illustrating a micro smoother according to an embodiment.
Figure 16:
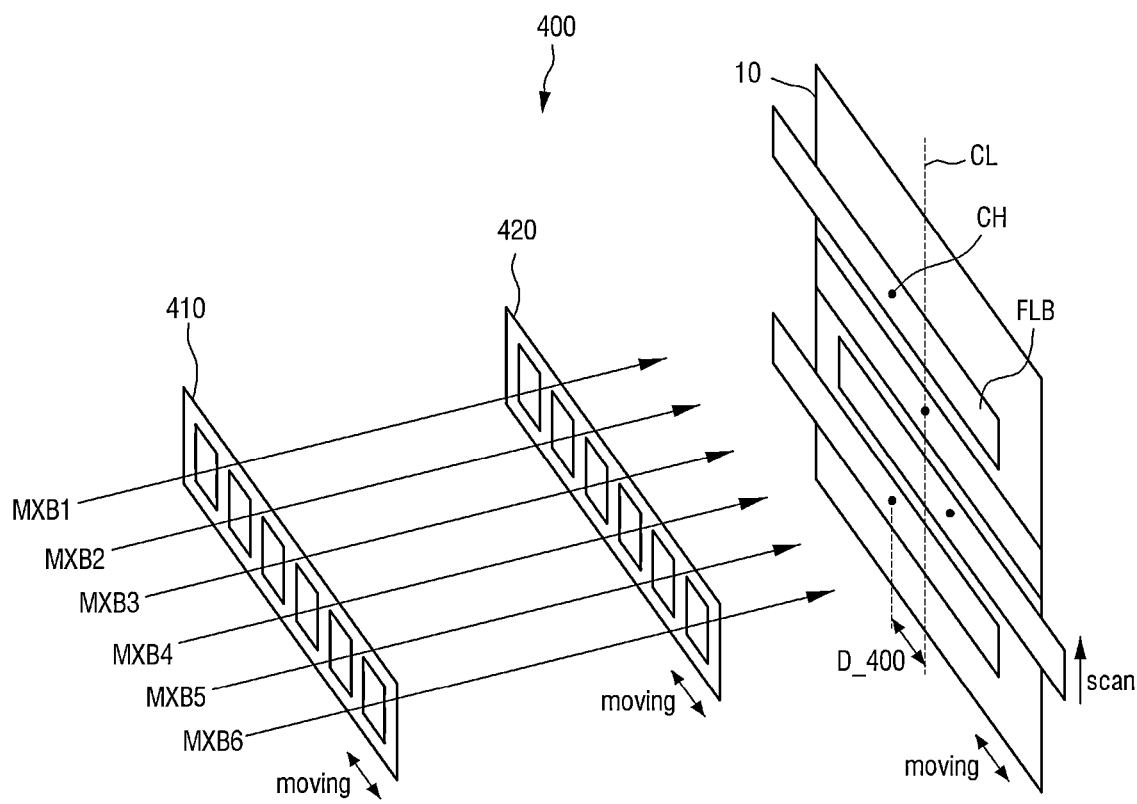
FIG. 16 is a perspective view illustrating an operation method of a micro smoother according to an embodiment.

FIG. 15 is a cross-sectional view illustrating a micro smoother according to an embodiment. FIG. 16 is a perspective view illustrating an operation method of a micro smoother according to an embodiment.

Referring to FIGS. 15 and 16 in addition to FIGS. 5, 6, 13, and 14, an embodiment of the micro smoother 400 may include the first micro smoother 410 and the second micro smoother 420. The first micro smoother 410 and the second micro smoother 420 may be disposed to be spaced apart from each other along the path direction Lz of the mixing beam MXB.

Each of the first micro smoother 410 and the second micro smoother 420 may include a smoother cover 401, a floating box 402, an elastic tube 403, a smoother optical module 404, a weight 405, and a smoother driver 406.

The smoother cover 401 may provide a space in which the floating box 402, the elastic tube 403, and the smoother optical module 404 are disposed. Nitrogen ($N_2$) gas may be filled in the space partitioned by the smoother cover 401. Accordingly, it is possible to effectively prevent external impacts from being transmitted to the smoother optical module 404 inside the floating box 402 or vibrations inside the micro smoother 400 from being transmitted to other parts of the display device manufacturing apparatus 1000.

The floating box 402 may be disposed in a space partitioned (or enclosed) by the smoother cover 401. The floating box 402 may float within a space partitioned by the smoother cover 401. In an embodiment, for example, floating box 402 may be an air bearing box or an air floating box. As the floating box 402 floats, it is possible to effectively prevent external impacts from being transmitted to the smoother optical module 404 inside the floating box 402 or vibrations inside the micro smoother 400 from being transmitted to other parts of the display device manufacturing apparatus 1000.

The elastic tube 403 may be connected to the inner surface of the smoother cover 401 and the outer surface of the floating box 402. In FIG. 15, for convenience of illustration, four elastic tubes 403 are shown, but the number of elastic tubes 403 is not limited thereto. The elastic tube 403 may effectively prevent the floating box 402 that floats from moving excessively.

The smoother optical module 404 may adjust the movement path and traveling direction of the mixing beam MXB. In an embodiment, for example, the smoother optical module 404 may include a small and lightweight optical device. In an embodiment, the smoother optical module 404 included in the first micro smoother 410 may be a telescope lens. In an embodiment, the smoother optical module 404 included in the second micro smoother 420 may be a homogenizer. The telescope lens of the first micro smoother 410 and the homogenizer of the second micro smoother 420 may adjust the movement path and traveling direction in the major axis direction Lx but are not limited thereto, and may also adjust the movement path and traveling direction of the minor axis direction Ly.

In some embodiments, all the first micro smoother 410 and the second micro smoother 420 may be driven, or only one of the first micro smoother 410 and the second micro smoother 420 may be driven.

A small and lightweight optical device included in the smoother optical module 404 may correspond to each of a plurality of mixing beams MXB. In an embodiment, for example, a total of six small and lightweight optical devices may be disposed corresponding to the first to sixth mixing beams MXB1, MXB2, MXB3, MXB4, MXB5, and MXB6, respectively. The number of small and lightweight optical devices may be variously modified depending on the number of mixing beams MXB.

The weight 405 may support the smoother cover 401. The weight 405 may prevent the smoother cover 401 from shaking due to external impacts.

The smoother driver 406 may provide driving force to the floating box 402. The smoother driver 406 may provide driving force to move the smoother optical module 404 in the major axis direction Lx of the laser beam. In an embodiment, for example, the smoother driver 406 may provide driving force to move the floating box 402 along the second direction DR2. However, the disclosure is not limited thereto, and the smoother driver 406 may provide driving force such that the floating box 402 moves along the first direction DR1.

The micro smoother 400 may be a device that generates shaking of the laser beam regularly or irregularly. By intentionally causing the laser beam to shake by the micro smoother 400, horizontal mura that may occur during crystallization of the silicon thin film may be effectively prevented.

In an embodiment, for example, as described above with reference to FIG. 4A, the final laser beam FLB may have a flat top type profile shape. However, when some uneven stepped portions occur in the flat top shape or there are particles or the like in the path of the laser beam, energy imbalance may occur in a portion of the laser beam due to the stepped portions, the particles, or the like. In this way, when a certain area of the substrate is irradiated with the portion of the laser beam in which such energy imbalance has occurred to perform scanning, horizontal mura may occur along the portion in which the imbalance has occurred.

In the display device manufacturing apparatus 1000 according to an embodiment, the first micro smoother 410 and the second micro smoother 420 may be driven in the major axis direction Lx. In an embodiment, for example, the first micro smoother 410 and the second micro smoother 420 may perform regular or irregular vibration movements in the major axis direction Lx. Accordingly, a central hit point CH of the final laser beam FLB may deviate from a center line CL of the target substrate 10 by a first vibration distance D_400 in the major axis direction Lx. In an embodiment, the first vibration distance D_400 may be in a range of about 30 mm to about 60 mm. In an embodiment, for example, the first vibration distance D_400 may be in a range of about 40 mm to about 50 mm.

In this way, by causing the micro smoother 400 to intentionally shake the laser beam, it is possible to effectively prevent a specific hit point from continuously moving along the minor axis direction Ly, that is, the scan direction, and forming horizontal mura, and the energy imbalance may be offset. Accordingly, the occurrence of horizontal mura may be effectively prevented.

In an embodiment, as described above, the laser beam of the display device manufacturing apparatus 1000 may have a high repetition rate. Accordingly, the number of times the final laser beam FLB is radiated to the target substrate 10 may increase. Accordingly, it is desired to drive the micro smoother 400 at high speed according to the number of radiation times of the final laser beam FLB. The micro smoother 400 according to an embodiment may realize high-speed driving by including a small and lightweight optical device. In an embodiment, the frequency of the smoother driver 406 may be in a range of about 50 hertz (Hz) to about 250 hertz (Hz).

In some embodiments, the target substrate 10 may be driven directly in the major axis direction Lx. Accordingly, the central hit point CH of the final laser beam FLB may deviate from the center line CL of the target substrate 10 by the first vibration distance D_400 in the major axis direction Lx. In an embodiment, the driving speed of the target substrate 10 may be the same as the scanning speed of the target substrate 10. In an embodiment, for example, the driving speed of the target substrate 10 may be about 20 millimeters per second (mm/s). However, the disclosure is not limited thereto, and the driving speed of the target substrate 10 may be faster than the scanning speed of the target substrate 10. In this case, the driving speed of the target substrate 10 may be about 30 mm/s.

Figure 17:
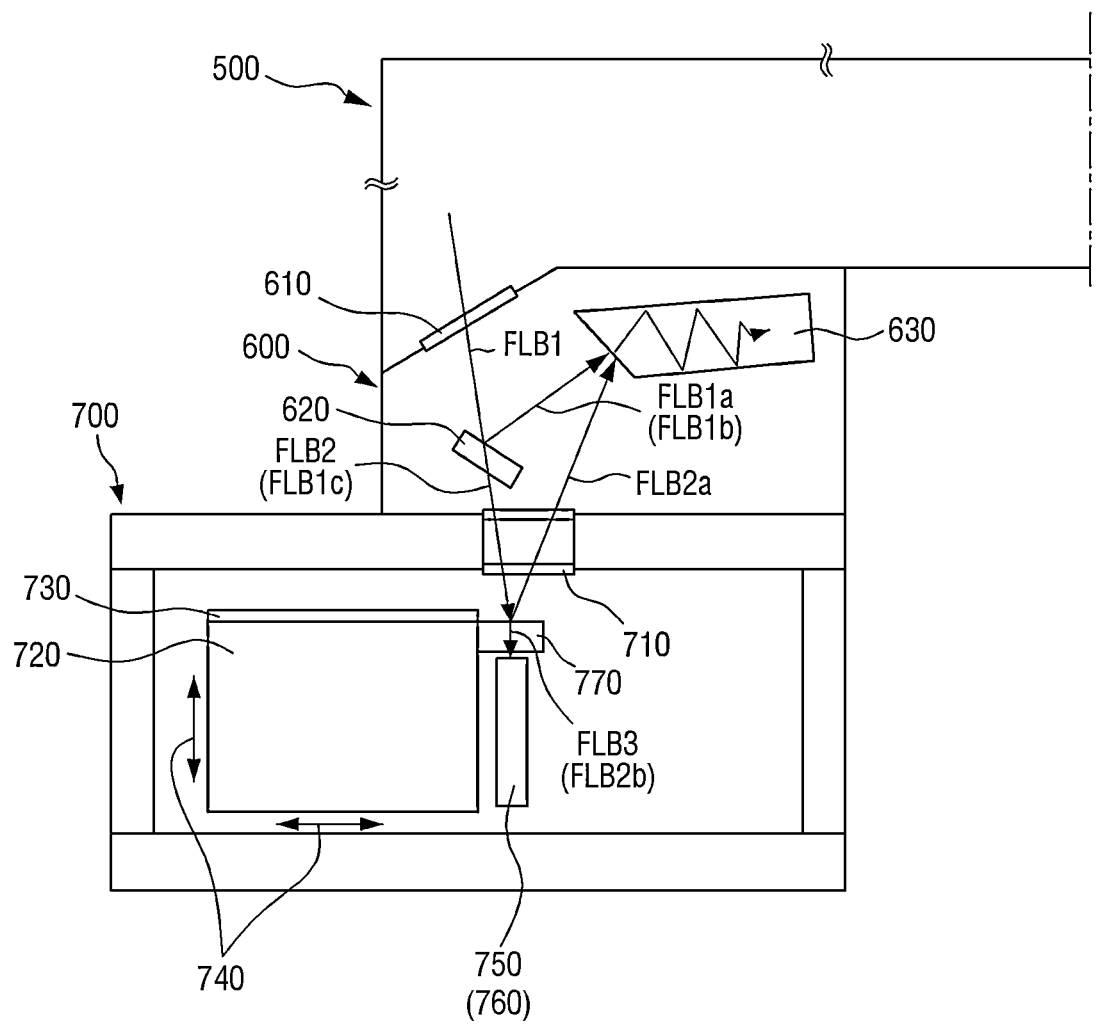
FIG. 17 is a cross-sectional view illustrating an optical module, a seal box, and a chamber according to an embodiment.
Figure 20:
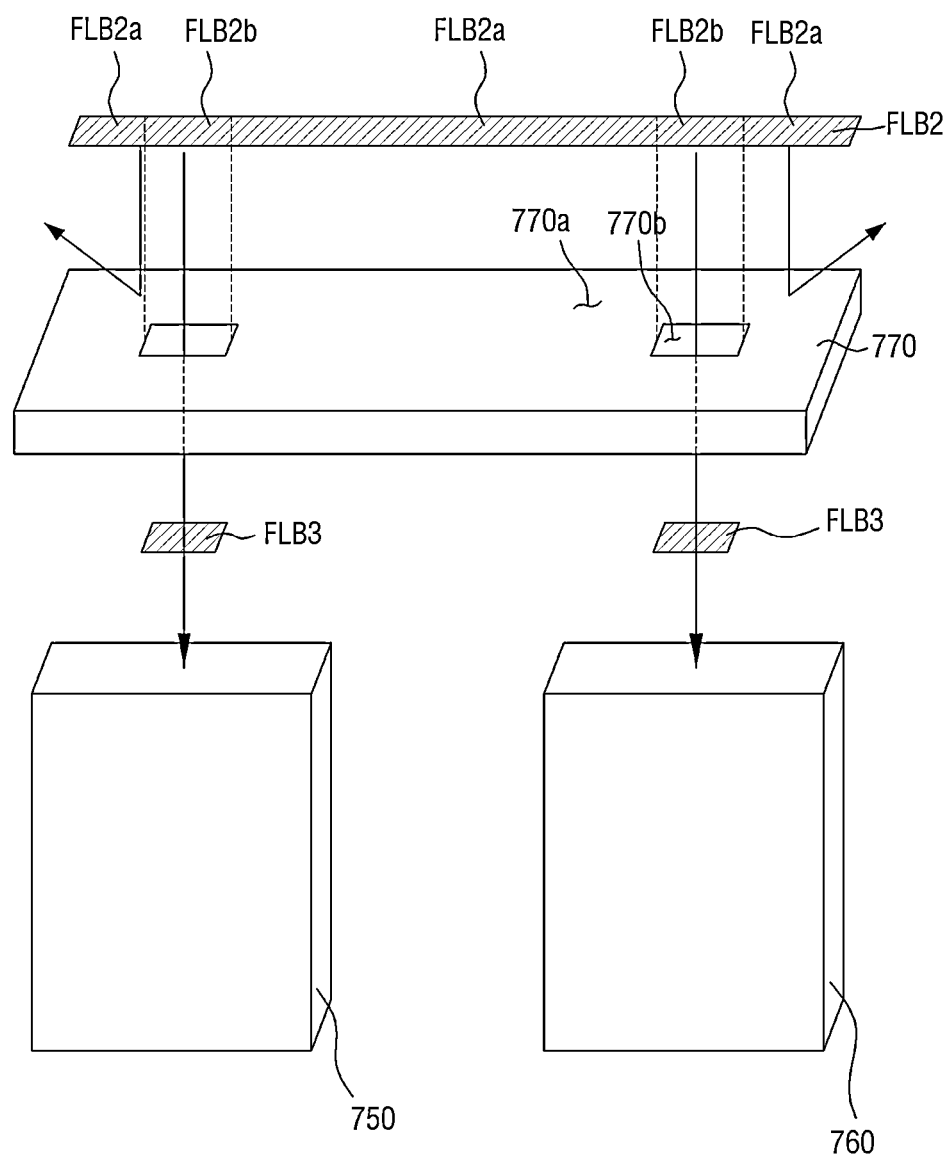
FIG. 20 is a perspective view illustrating a profile meter, a power meter, and a measurement aperture according to an embodiment.

FIG. 17 is a cross-sectional view illustrating an optical module, a seal box, and a chamber according to an embodiment. FIG. 18 is a cross-sectional view illustrating an operation method of a beam cutter according to an embodiment. FIG. 19 is a plan view illustrating a fixing chuck and a target substrate according to an embodiment. FIG. 20 is a perspective view illustrating a profile meter, a power meter, and a measurement aperture according to an embodiment.

Referring to FIGS. 17 to 20 in addition to FIGS. 5, 6, and 13, the laser beam that has passed through the optical module 500 may pass further through the seal box 600 and reach the chamber 700.

The seal box 600 may provide a space for processing the final laser beam FLB that has passed through the optical module 500. In an embodiment, the seal box 600 may include a seal box window 610, a beam cutter 620, and a beam dump 630.

The seal box window 610 may be disposed between the optical module 500 and the seal box 600. In an embodiment, for example, the seal box window 610 may be disposed on a partition wall positioned between the optical module 500 and the seal box 600. The seal box window 610 may be an optical passage through which the final laser beam FLB that has passed through the optical module 500 may move inside the seal box 600. The seal box window 610 may include or be made of a material that allows the final laser beam FLB to pass therethrough.

The beam cutter 620 may adjust the major axis size Dx of the final laser beam FLB. The beam cutter 620 may overlap at least a portion of the final laser beam FLB in the path direction Lz of the laser beam. The beam cutter 620 may reflect at least a portion of the final laser beam FLB and transmit the remaining portion thereof.

In an embodiment, for example, the beam cutter 620 may include a first portion 621 and a second portion 622 disposed to be spaced apart from each other in the major axis direction Lx of the laser beam, and a third portion 623 disposed between the first portion 621 and the second portion 622.

The first portion 621 and the second portion 622 of the beam cutter 620 may be reflection areas, and the third portion 623 may be a transmission area. In an embodiment, the first portion 621 and the second portion 622 may include a reflection mirror, and the third portion 623 may include a transmission window. In another embodiment, the first portion 621 and the second portion 622 may be treated with a high reflection (HR) coating (or include a high reflection coating film), and the third portion 623 may be treated with an anti-reflection (AR) coating (or include an anti-reflection (AR) coating film).

The first portion 621 of the beam cutter 620 may overlap one end FLB1a of a before-processing final laser beam FLB1 in the path direction Lz. The second portion 622 of the beam cutter 620 may overlap the other end FLB1b of the before-processing final laser beam FLB1 in the path direction Lz. The third portion 623 of the beam cutter 620 may overlap a central portion FLB1c positioned between the one end FLB1a and the other end FLB1b of the before-processing final laser beam FLB1 in the path direction Lz.

The one end FLB1a and the other end FLB1b of the before-processing final laser beam FLB1 may be reflected from the first portion 621 and the second portion 622 of the beam cutter 620, respectively, and the central portion FLB1c of the before-processing final laser beam FLB1 may be transmitted through the third portion 623. The transmitted central portion FLB1c may form a final laser beam FLB2 processed by adjusting the major axis size Dx. The processed final laser beam FLB2 may reach the target substrate 10.

In some embodiments, the beam cutter 620 may include only one of the first portion 621 and the second portion 622. In such embodiments, the beam cutter 620 may reflect only one portion of the one end FLB1a and the other end FLB1b of the final laser beam FLB to adjust the major axis size Dx of the final laser beam FLB.

In an embodiment, the reflection surfaces of the first portion 621 and the second portion 622 of the beam cutter 620 may include a heat-resistant material. In an embodiment, for example, the first portion 621 and the second portion 622 of the beam cutter 620 may include glass. Since the display device manufacturing apparatus 1000 according to an embodiment uses a laser beam having a high repetition rate and high energy, the reflection surfaces of the first portion 621 and the second portion 622 may continuously receive energy from the laser before the temperature cools down despite the cooling system. Since the reflection surfaces of the first portion 621 and the second portion 622 include a heat-resistant material, thermal deformation due to temperature rise may be effectively prevented.

The beam dump 630 may attenuate or extinguish the energy of the laser beam reflected from the beam cutter 620 and the laser beam reflected from a measurement aperture 770. The beam dump 630 may include a reflection mirror on the inner surface of the beam dump 630. The beam dump 630 may include a cooling system, such as coolant, inside the beam dump 630.

In an embodiment, for example, the one end FLB1$a$ and the other end FLB1$b$ of the before-processing final laser beam FLB1 reflected from the first portion 621 and the second portion 622 of the beam cutter 620 may move inside the beam dump 630. The laser beam that enters the beam dump 630 may be continuously reflected by the reflection mirror inside the beam dump 630 and may collide with the cooling system. Accordingly, the energy of the laser beam may be attenuated or extinguished.

In an embodiment, the chamber 700 may include a chamber window 710, a stage 720, a fixing chuck 730, a stage driver 740, a profile meter 750, a power meter 760, and a measurement aperture 770.

The chamber window 710 may be disposed between the seal box 600 and the chamber 700. In an embodiment, for example, the chamber window 710 may be disposed on a partition wall positioned between the seal box 600 and the chamber 700. The chamber window 710 may be an optical passage through which the final laser beam FLB that has passed through the seal box 600 may move inside the chamber 700. The chamber window 710 may include or be made of a material that allows the final laser beam FLB to pass therethrough.

The stage 720 may be disposed inside the chamber 700. The stage 720 may provide a space in which the target substrate 10 is seated. In an embodiment, for example, the target substrate 10 may be seated on the stage 720 during an annealing process.

The fixing chuck 730 may be disposed on the stage 720. The fixing chuck 730 may fix the target substrate 10 to the stage 720 such that the target substrate 10 is not separated from the stage 720 during the annealing process. In an embodiment, the fixing chuck 730 may be a vacuum chuck using suction force. In another embodiment, the fixing chuck 730 may be an electrostatic chuck using electromagnetic force. However, the disclosure is not limited thereto, and the fixing chuck 730 may include any device capable of fixing the target substrate 10 to the stage 720.

In some embodiments, as illustrated in FIG. 19, the fixing chuck 730 may be larger than the target substrate 10. The target substrate 10 may include a laser irradiation area LSA and a laser non-irradiation area NLSA. The laser irradiation area LSA may be an area where the final laser beam FLB is irradiated, and the laser non-irradiation area NLSA may be an area where the final laser beam FLB is not irradiated.

In some embodiments, the fixing chuck 730 may not apply fixing force to the target substrate 10 in the area overlapping the laser irradiation area LSA, and may apply fixing force to the target substrate 10 in the area overlapping the laser non-irradiation area NLSA.

In an embodiment, for example, depending on the roughness of the surface of the fixing chuck 730, on which the fixing chuck 730 and the target substrate 10 are in contact, cone mura may occur by a height difference due to the roughness. The fixing chuck 730 according to an embodiment may effectively prevent cone mura due to surface roughness of the fixing chuck 730 by not applying fixing force in the area overlapping the laser irradiation area LSA.

The stage driver 740 may provide driving force to the stage 720. In an embodiment, for example, the stage driver 740 may move the stage 720 in the first direction DR1 or the minor axis direction Ly. In another embodiment, for example, the stage driver 740 may move the stage 720 in the second direction DR2 or the major axis direction Lx. In another embodiment, for example, the stage driver 740 may move the stage 720 in the third direction DR3 or the path direction Lz.

The profile meter 750 may measure the energy profile of the final laser beam FLB. In an embodiment, for example, the profile meter 750 may measure the pulse shape of the final laser beam FLB reaching the target substrate 10.

The power meter 760 may measure the energy power of the final laser beam FLB. In an embodiment, for example, the power meter 760 may measure the energy density of the final laser beam FLB reaching the target substrate 10. In such an embodiment, at least one selected from the profile meter 750 and the power meter 760 may be individually or collectively referred to as a meter.

The measurement aperture 770 may adjust the shape and size of the final laser beam FLB reaching the profile meter 750 and the power meter 760. When the final laser beam FLB provided to the target substrate 10 is directly radiated to the profile meter 750 and the power meter 760, the profile meter 750, the power meter 760, and the equipment of the vicinity may be damaged by the high energy of the final laser beam FLB. The measurement aperture 770 according to an embodiment may effectively prevent such damage by adjusting the shape and size of the final laser beam FLB.

As illustrated in FIG. 20, the measurement aperture 770 may overlap the final laser beam FLB2 processed by passing through the beam cutter 620 in the path direction Lz. The measurement aperture 770 may reflect at least a portion of the processed final laser beam FLB2 and transmit the remaining portion.

In an embodiment, for example, the measurement aperture 770 may include a reflection area 770$a$ and a transmission area 770$b$. The transmission area 770$b$ may overlap a beam receiving portion (not illustrated) of the profile meter 750 and a beam receiving portion (not illustrated) of the power meter 760 in the path direction Lz. In some embodiments, the reflection area 770$a$ may surround the transmission area 770$b$, but is not limited thereto.

In an embodiment, the reflection area 770$a$ may include a reflection mirror, and the transmission area 770$b$ may include a hole or a transmission window. In another embodiment, the reflection area 770$a$ may be treated with a high reflection (HR) coating, and the transmission area 770$b$ may be treated with an anti-reflection (AR) coating.

The reflection area 770$a$ may overlap one portion FLB2$a$ of the processed final laser beam FLB2 in the path direction Lz. The transmission area 770$b$ may overlap the other portion FLB2$b$ of the processed final laser beam FLB2 in the path direction Lz.

The one portion FLB2$a$ of the processed final laser beam FLB2 may be reflected in the reflection area 770$a$, and the other portion FLB2$b$ of the processed final laser beam FLB2 may be transmitted in the transmission area 770$b$. The shape and size of the transmitted other portion FLB2b may be adjusted to form a reduced final laser beam FLB3. The reduced final laser beam FLB3 may reach the beam receiving portion (not illustrated) of the profile meter 750 and the beam receiving portion (not illustrated) of the power meter 760.

The reflected one portion FLB2a may move inside the beam dump 630, and the energy thereof may be attenuated or extinguished in the same manner as the laser beam reflected from the beam cutter 620.

By including the measurement aperture 770, the display device manufacturing apparatus 1000 according to an embodiment may effectively prevent the final laser beam FLB from reaching other portions except the beam receiving portion (not illustrated) of the profile meter 750 and the beam receiving portion (not illustrated) of the power meter 760, and thus may minimize equipment damage.

The display device manufacturing apparatus 1000 according to an embodiment is the solid-state laser annealing apparatus, which uses a laser with higher energy and higher repetition rate than the excimer laser annealing apparatus, and has a faster process speed than the excimer laser annealing apparatus, so that it is desired that optical system configurations and other equipment designs suitable for such characteristics are included.

Figure 21:
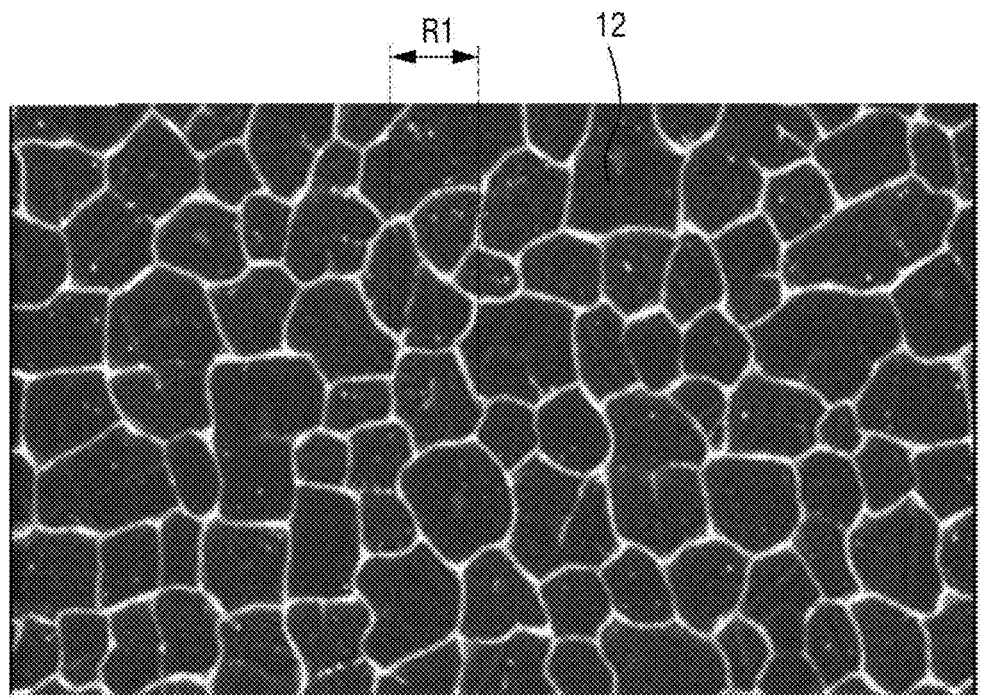
FIG. 21 is a microscopic image illustrating particles of a polycrystalline silicon thin film according to a conventional embodiment.
Figure 22:
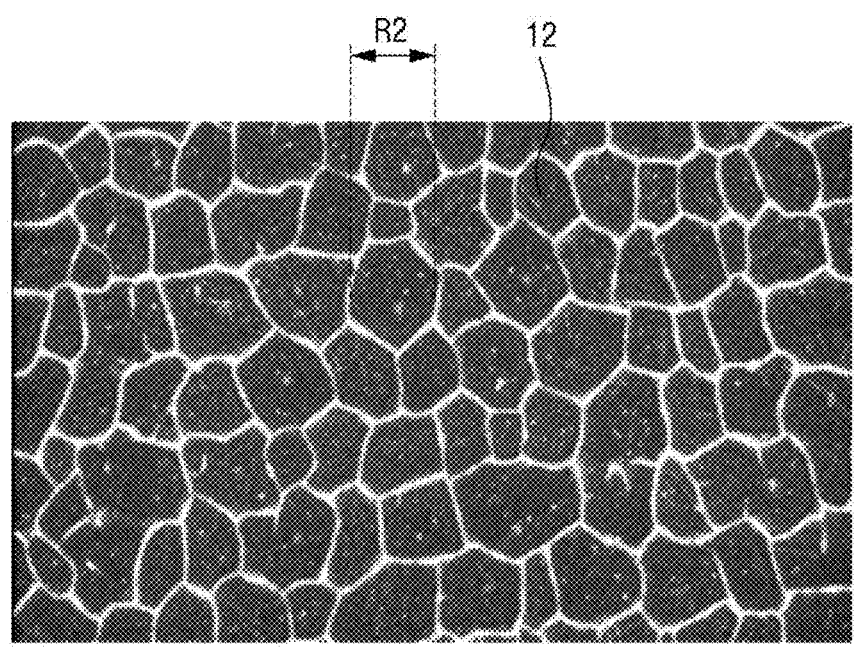
FIG. 22 is a microscopic image illustrating particles of a polycrystalline silicon thin film according to an embodiment.
Figure 23:
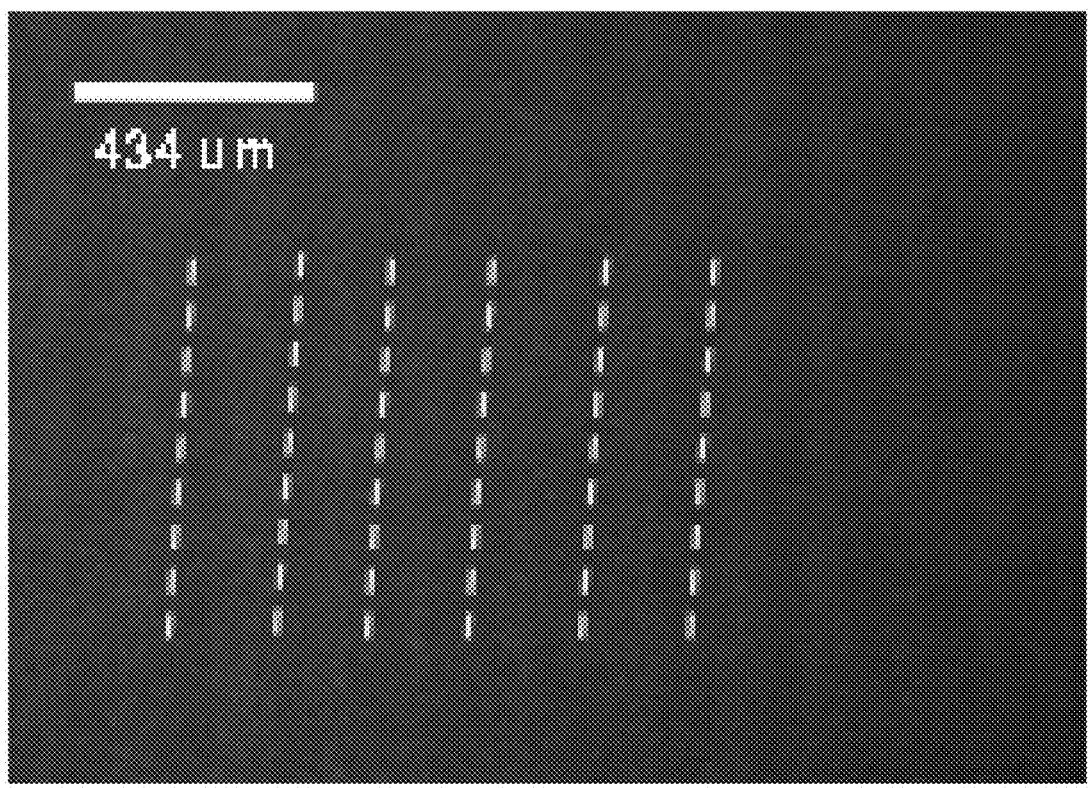
FIG. 23 is a photograph illustrating a macro inspection of a polycrystalline silicon thin film according to the conventional embodiment.
Figure 24:
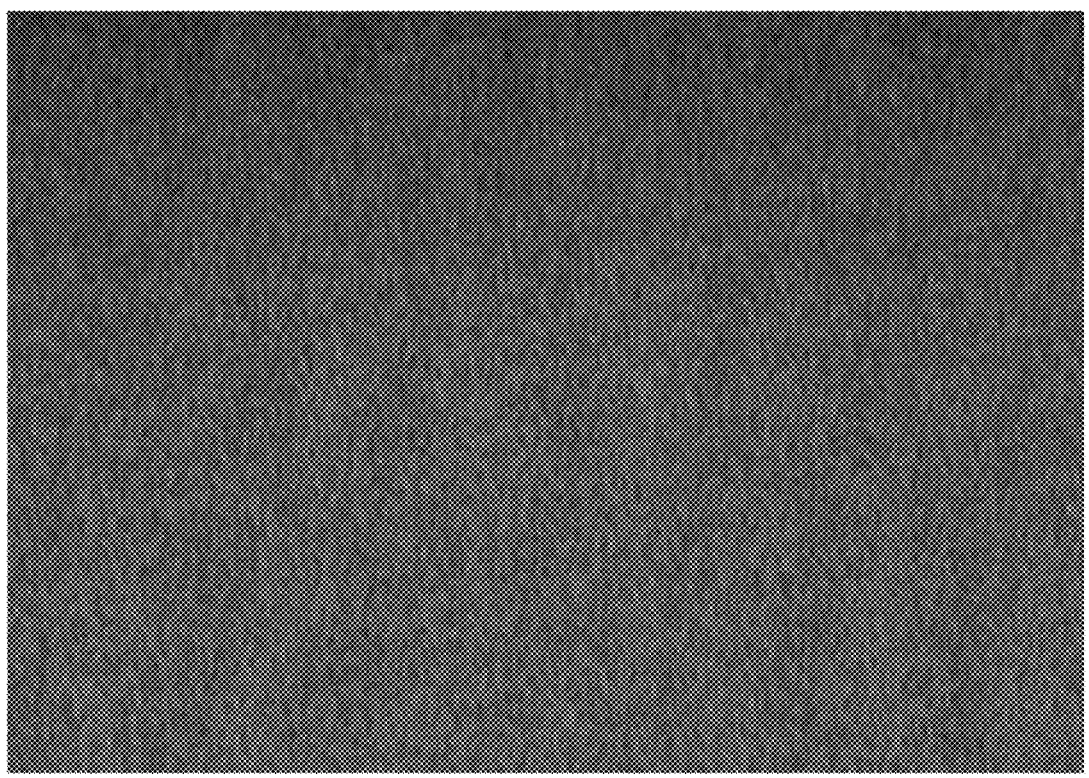
FIG. 24 is a photograph illustrating a macro inspection of a polycrystalline silicon thin film according to an embodiment.

FIG. 21 is a microscopic image illustrating particles of a polycrystalline silicon thin film according to a conventional embodiment. FIG. 22 is a microscopic image illustrating particles of a polycrystalline silicon thin film according to an embodiment. FIG. 23 is a photograph illustrating a macro inspection of a polycrystalline silicon thin film according to the conventional embodiment. FIG. 24 is a photograph illustrating a macro inspection of a polycrystalline silicon thin film according to an embodiment.

Referring to FIGS. 21 to 24, FIGS. 21 and 23 are photographs of the polycrystalline silicon thin film 12 that has been annealed using an excimer laser annealing apparatus as the display device manufacturing apparatus 1000 according to the conventional embodiment. FIGS. 22 and 24 are photographs of the polycrystalline silicon thin film 12 that has been annealed using a solid-state laser annealing apparatus as the display device manufacturing apparatus 1000 according to an embodiment.

As illustrated in FIG. 21, the average of a first particle size R1 of the polycrystalline silicon thin film 12 manufactured using the display device manufacturing apparatus 1000 according to the conventional embodiment may be approximately within 310 nm. On the other hand, as illustrated in FIG. 22, the average of a second particle size R2 of the polycrystalline silicon thin film 12 manufactured using the display device manufacturing apparatus 1000 according to an embodiment may be approximately within 340 nm.

The display device manufacturing apparatus 1000 according to the conventional embodiment is an excimer laser annealing apparatus, and since the length of the laser wavelength is in a range of about 300 nm to about 315 nm, the average of the first particle size R1 may be about 310 nm or less. On the other hand, the display device manufacturing apparatus 1000 according to an embodiment is a solid-state laser annealing apparatus, and since the laser wavelength is in a range of about 337 nm to about 357 nm, the average of the first particle size R1 may be about 340 nm or less.

In addition, the standard deviation of the second particle size R2 may be smaller than the standard deviation of the first particle size R1 of the polycrystalline silicon thin film 12 manufactured using the display device manufacturing apparatus 1000 according to the conventional embodiment.

The display device manufacturing apparatus 1000 according to an embodiment may have higher energy, a higher repetition rate, and a faster process speed than the display device manufacturing apparatus 1000 according to the conventional embodiment, so that the particle size distribution may be more even.

As illustrated in FIG. 23, the polycrystalline silicon thin film 12 manufactured using the display device manufacturing apparatus 1000 according to the conventional embodiment may include vertical mura. On the other hand, as illustrated in FIG. 24, the polycrystalline silicon thin film 12 manufactured using the display device manufacturing apparatus 1000 according to an embodiment may not include vertical mura.

In the display device manufacturing apparatus 1000 according to an embodiment, vertical mura may not occur due to characteristics such as a shorter scan interval, higher irradiation count, higher energy, and higher frequency than the display device manufacturing apparatus 1000 according to the conventional embodiment.

In addition, the display device manufacturing apparatus 1000 according to an embodiment, which is a solid-state laser annealing apparatus, may operate without performing a complex equipment operation such as stage tilting, a scan interval that is an integer multiple of the thin film transistor arrangement spacing, and stage vector driving used in an excimer laser annealing apparatus to effectively prevent vertical mura, such that process efficiency and high crystallization quality may be achieved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An apparatus for manufacturing a display device, the apparatus comprising:
a chamber;
a laser module comprising a plurality of laser generators which respectively generates a plurality of raw laser beams using a solid material as a medium;
a beam coupling module which combines the plurality of raw laser beams into a plurality of coupling beams;
a beam mixing unit which converts the plurality of coupling beams into a plurality of mixing beams;
a micro smoother which induces vibration movements of the plurality of mixing beams;
an optical module which converts the plurality of mixing beams passed through the micro smoother into a final laser beam, and directs the final laser beam to the chamber; and
a seal box disposed between the optical module and the chamber.

2. The apparatus of claim 1, wherein
a major axis size of the final laser beam is in a range of about 1,000 millimeters to about 2,000 millimeters,
a minor axis size of the final laser beam is in a range of about 95 micrometers to about 110 micrometers, and
a horizontal length of a lateral inclined surface of the final laser beam is in a range of about 30 micrometers to about 45 micrometers.

3. The apparatus of claim 1, wherein
a total laser output of the laser module is in a range of about 5,760 watts to about 9,000 watts,
an output of each of the plurality of laser generators is in a range of about 600 watts to about 900 watts, and
an oscillation frequency of each of the plurality of laser generators is in a range of about 5,000 hertz to about 15,000 hertz.

4. The apparatus of claim 1, wherein
each of the plurality of raw laser beams is a laser beam in an ultraviolet region, and
a wavelength of each of the plurality of raw laser beams is in a range of about 337 nanometers to about 357 nanometers.

5. The apparatus of claim 1, wherein
the beam coupling module comprises:
  a shutter which receives the plurality of raw laser beams; and
  a photodiode and a beam monitor which monitor the plurality of raw laser beams,
wherein an operation speed of the shutter is in a range of about 20 milliseconds to about 100 milliseconds.

6. The apparatus of claim 1, wherein the beam coupling module comprises:
  a scraper unit which generates the plurality of coupling beams, wherein the scraper unit groups the plurality of raw laser beams to be included in the plurality of coupling beams;
  a group telescope unit which adjusts a degree of diffusion of the plurality of coupling beams; and
  a group coupling unit which provides the plurality of coupling beams to the beam mixing unit.

7. The apparatus of claim 6, wherein
the scraper unit comprises a pre-mixer, and
the pre-mixer transmits and reflects the plurality of coupling beams which are incident at a 1 ratio of 1:1.

8. The apparatus of claim 6, wherein the beam coupling module further comprises a pulse extender module disposed between the group coupling unit and the beam mixing unit, wherein the pulse extender module extends a pulse duration of the final laser beam.

9. The apparatus of claim 1, wherein the beam mixing unit comprises:
  a reflection mirror which reflects the plurality of incident coupling beams incident thereto;
  a first splitter which transmits and reflects the plurality of incident coupling beams at a ratio of 1:1; and
  a second splitter which transmits and reflects the plurality of incident coupling beams at a ratio of 2:1.

10. The apparatus of claim 9, wherein the beam mixing unit generates the plurality of mixing beams by combining the plurality of coupling beams at a same ratio.

11. The apparatus of claim 1, wherein the micro smoother provides a driving force to regularly or irregularly vibrate a hit point of the final laser beam with respect to a direction perpendicular to a scan direction of the final laser beam.

12. The apparatus of claim 11, wherein the micro smoother comprises at least one selected from:
  a first micro smoother comprising a telescope lens; and
  a second micro smoother comprising a homogenizer.

13. The apparatus of claim 11, wherein the micro smoother comprises:
  a cover;
  a floating box disposed in an inner space of the cover in a floating state; and
  an elastic tube connecting the floating box to the cover.

14. The apparatus of claim 1, further comprising:
  a first section where the micro smoother is located;
  a second section where the chamber is located; and
  a basic frame disposed below the chamber and the micro smoother, wherein
  the basic frame comprises a first pedestal disposed in the first section and a second pedestal disposed in the second section, and
  the first pedestal and the second pedestal are disposed to be spaced apart from each other.

15. The apparatus of claim 14, wherein
the optical module comprises a first sub-optical module disposed in the first section, and a second sub-optical module disposed in the second section, and
the first sub-optical module and the second sub-optical module are disposed to be spaced apart from each other.

16. The apparatus of claim 1, wherein the seal box comprises:
  a beam cutter which reflects a portion of the final laser beam and transmits a remaining portion of the final laser beam; and
  a beam dump which attenuates or extinguishes energy of the portion of the final laser beam reflected from the beam cutter.

17. The apparatus of claim 16, wherein
the beam cutter comprises a reflection area which reflects the final laser beam, and
a surface of the reflection area includes glass.

18. The apparatus of claim 16, further comprising:
  a reflection mirror disposed on an inner surface of the beam dump, and
  a cooler disposed inside the beam dump.

19. The apparatus of claim 1, wherein the chamber comprises:
  a meter which measures a profile or power of the final laser beam; and
  a measurement aperture disposed on the meter, wherein the measurement aperture reflects a portion of the final laser beam and transmits a remaining portion.

20. The apparatus of claim 19, wherein
the measurement aperture comprises:
  a reflection area which reflects the final laser beam; and
  a transmission area which transmits the final laser beam,
the reflection area comprises a high reflection coating film, and
the transmission area comprises an anti-reflection coating film or a hole.

* * * * *